U S010430978B2

(12) United States Patent
Yumer et al.

(10) Patent No.: US 10,430,978 B2
(45) Date of Patent: Oct. 1, 2019

(54) EDITING DIGITAL IMAGES UTILIZING A NEURAL NETWORK WITH AN IN-NETWORK RENDERING LAYER

(71) Applicant: Adobe Inc., San Jose, CA (US)

(72) Inventors: Mehmet Yumer, San Jose, CA (US); Jimei Yang, Merced, CA (US); Guilin Liu, Fairfax, VA (US); Duygu Ceylan Aksit, Mountain View, CA (US)

(73) Assignee: Adobe Inc., San Jose, CA (US)

( * ) Notice: Subject to any disclaimer, the term of this patent is extended or adjusted under 35 U.S.C. 154(b) by 135 days.

(21) Appl. No.: 15/448,206

(22) Filed: Mar. 2, 2017

(65) Prior Publication Data

US 2018/0253869 A1   Sep. 6, 2018

(51) Int. Cl.
| | |
|---|---|
| *G06T 11/00* | (2006.01) |
| *G06F 17/50* | (2006.01) |
| *G06T 11/60* | (2006.01) |
| *G06N 3/04* | (2006.01) |
| *G06N 3/08* | (2006.01) |

(52) U.S. Cl.
CPC ............ *G06T 11/001* (2013.01); *G06F 17/50* (2013.01); *G06N 3/0454* (2013.01); *G06T 11/60* (2013.01); *G06N 3/082* (2013.01)

(58) Field of Classification Search
CPC .............................. G06T 11/001; G06F 17/50
See application file for complete search history.

(56) References Cited

U.S. PATENT DOCUMENTS

2010/0290032 A1*  11/2010  Bugge .................. B07C 5/342
                                                                        356/51
2018/0232471 A1*   8/2018  Schissler ............ G06F 17/5009

FOREIGN PATENT DOCUMENTS

| CN | 107067429 A | 8/2017 |
| FR | 2895823 A1 | 7/2007 |

OTHER PUBLICATIONS

Khan et al., Image-based Material Editing (document #9 from the IDS filed Mar. 16, 2017) (Year: 2006).*
J. T. Barron and J. Malik. Shape, illumination, and reflectance from shading. IEEE PAMI, 2015.
(Continued)

*Primary Examiner* — Matthew Salvucci
(74) *Attorney, Agent, or Firm* — Keller Jolley Preece

(57) ABSTRACT

The present disclosure includes methods and systems for generating modified digital images utilizing a neural network that includes a rendering layer. In particular, the disclosed systems and methods can train a neural network to decompose an input digital image into intrinsic physical properties (e.g., such as material, illumination, and shape). Moreover, the systems and methods can substitute one of the intrinsic physical properties for a target property (e.g., a modified material, illumination, or shape). The systems and methods can utilize a rendering layer trained to synthesize a digital image to generate a modified digital image based on the target property and the remaining (unsubstituted) intrinsic physical properties. Systems and methods can increase the accuracy of modified digital images by generating modified digital images that realistically reflect a confluence of intrinsic physical properties of an input digital image and target (i.e., modified) properties.

20 Claims, 14 Drawing Sheets

(56) References Cited

OTHER PUBLICATIONS

H. G. Barrow and J. M. Tenenbaum. Recovering intrinsic scene characteristics from images. Technical Report 157, AI Center, SRI International, 333 Ravenswood Ave., Menlo Park, CA 94025, Apr. 1978.
I. Boyadzhiev, K. Bala, S. Paris, and E. Adelson. Bandsifting decomposition for image-based material editing. ACM TOG, 34(5):163:1-163:16, Nov. 2015.
A. X. Chang, T. Funkhouser, L. Guibas, P. Hanrahan, Q. Huang, Z. Li, S. Savarese, M. Savva, S. Song, H. Su, J. Xiao, L. Yi, and F. Yu. ShapeNet: An Information-Rich 3D Model Repository. Technical Report arXiv:1512.03012 [cs.GR], Stanford University—Princeton University—Toyota Technological Institute at Chicago, 2015.
D. Eigen and R. Fergus. Predicting depth, surface normals and semantic labels with a common multi-scale convolutional architecture. In IEEE ICCV, pp. 2650-2658, 2015.
S. Georgoulis, K. Rematas, T. Ritschel, M. Fritz, L. V. Gool, and T. Tuytelaars. Delight-net: Decomposing reflectance maps into specular materials and natural illumination. arxiv:1603.08240 [cs.cv], 2016.
J. Johnson, A. Alahi, and L. Fei-Fei. Perceptual losses for real-time style transfer and super-resolution. In IEEE ECCV, 2016.
M. K. Johnson and E. H. Adelson. Shape estimation in natural illumination. In Computer Vision and Pattern Recognition (CVPR), pp. 2553-2560, 2011.
E. A. Khan, E. Reinhard, R.W. Fleming, and H. H. Bulthoff. Image-based material editing. In ACM SIGGRAPH, pp. 654-663, 2006.
D. Kingma and J. Ba. Adam: A method for stochastic optimization. arXiv preprint arXiv:1412.6980, 2014.
T. D. Kulkarni, W. F. Whitney, P. Kohli, and J. Tenenbaum. Deep convolutional inverse graphics network. In NIPS, pp. 2539-2547. 2015.
S. Lombardi and K. Nishino. Reflectance and natural illumination from a single image. In IEEE ECCV, pp. 582-595. Springer, 2012.
S. Lombardi and K. Nishino. Reflectance and illumination recovery in the wild. IEEE Transactions on Pattern Analysis and Machine Intelligence, 38(1):129-141, Jan. 2015.
M. M. Loper and M. J. Black. OpenDR: An approximate differentiable renderer. In Computer Vision—ECCV 2014, vol. 8695 of Lecture Notes in Computer Science, pp. 154-169. Springer International Publishing, Sep. 2014.
W. Matusik, H. Pfister, M. Brand, and L. McMillan. A datadriven reflectance model. ACM Transactions on Graphics, 22(3):759-769, Jul. 2003.
T. Narihira, M. Maire, and S. X. Yu. Learning lightness from human judgement on relative reflectance. In IEEE CVPR, Jun. 2015.
F. E. Nicodemus, J. C. Richmond, J. J. Hsia, I. W. Ginsberg, and T. Limperis. Radiometry. chapter Geometrical Considerations and Nomenclature for Reflectance, pp. 94-145. Jones and Bartlett Publishers, Inc., USA, 1992.
K. Nishino. Directional statistics brdf model. In 2009 IEEE 12th International Conference on Computer Vision, pp. 476-483. IEEE, 2009.
G. Patow and X. Pueyo. A survey of inverse rendering problems. In CGF, vol. 22, pp. 663-687. Wiley Online Library, 2003.
K. Rematas, T. Ritschel, M. Fritz, E. Gavves, and T. Tuytelaars. Deep reflectance maps. In CVPR, 2016.
S. R. Richter and S. Roth. Discriminative shape from shading in uncalibrated illumination. In IEEE CVPR, pp. 1128-1136, Jun. 2015.
M. M. Takuya Narihira and S. X. Yu. Direct intrinsics: Learning albedo-shading decomposition by convolutional regression. In International Conference on Computer Vision (ICCV), 2015.
Y. Tang, R. Salakhutdinov, and G. Hinton. Deep lambertian networks. In ICML, 2012.
Z. Wang, A. C. Bovik, H. R. Sheikh, and E. P. Simoncelli. Image quality assessment: from error visibility to structural similarity. IEEE Trans. on Image Proc., 13(4):600-612, 2004.
L. F. Yu, S. K. Yeung, Y. W. Tai, and S. Lin. Shading based shape refinement of rgb-d images. In Computer Vision and Pattern Recognition (CVPR), 2013 IEEE Conference on, pp. 1415-1422, Jun. 2013.
R. Zhang, P.-S. Tsai, J. E. Cryer, and M. Shah. Shape from shading: A survey. IEEE PAMI, 21(8):690-706, 1999.
T. Zhou, P. Krhenbhl, and A. A. Efros. Learning data-driven reflectance priors for intrinsic image decomposition. In IEEE ICCV, pp. 3469-3477, 2015.
Combined Search and Examination Report as received in GB1718194.2 dated May 3, 2018.
Examination Report as received in GB1718194.2 dated Mar. 15, 2019.

\* cited by examiner

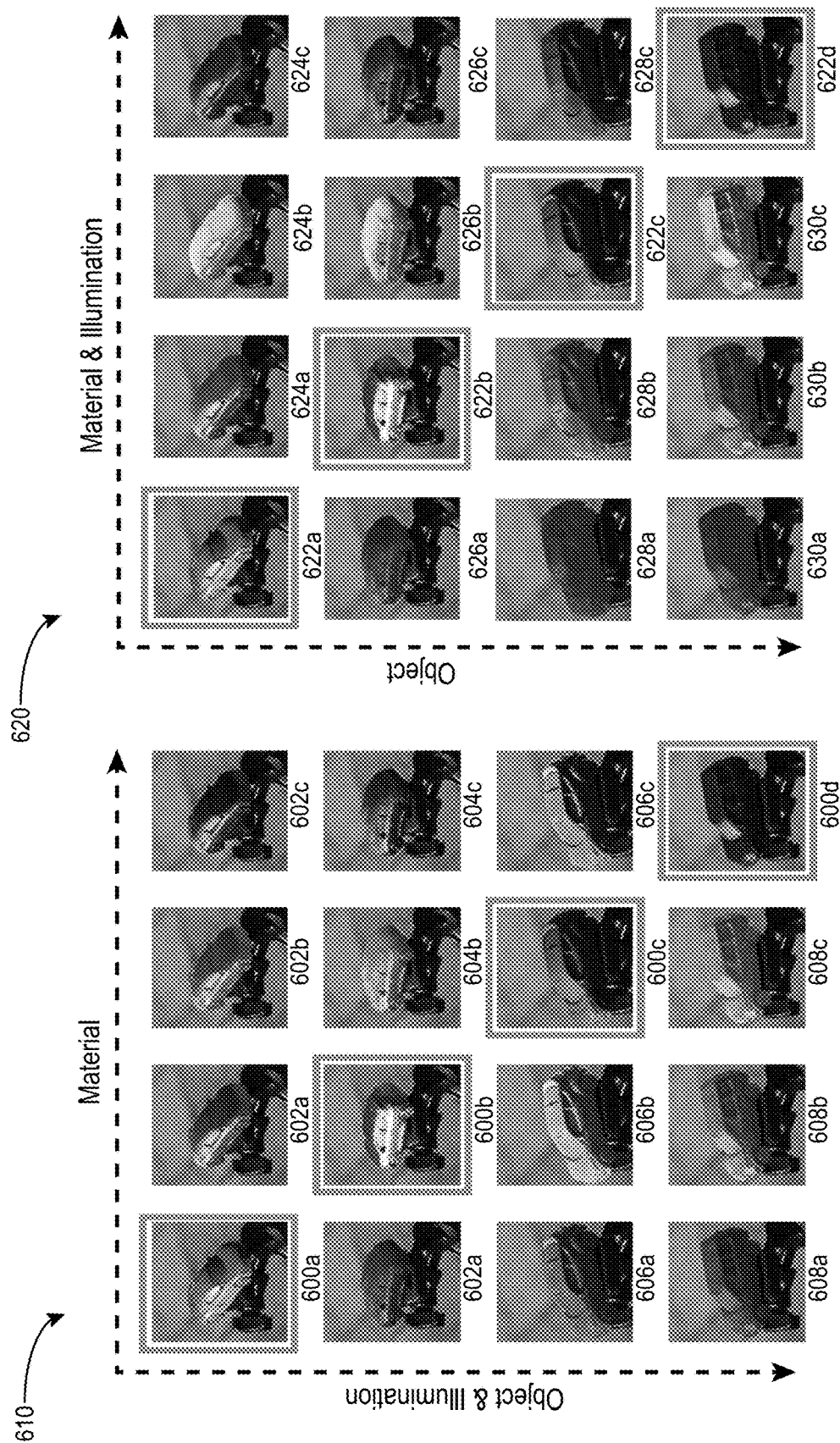

EDITING DIGITAL IMAGES UTILIZING A NEURAL NETWORK WITH AN IN-NETWORK RENDERING LAYER

BACKGROUND

Recent years have seen rapid development in the field of digital image editing. Indeed, due to advances in algorithms and hardware, conventional digital editing systems are now able to digitally modify a variety of image characteristics with simple user inputs. For example, conventional digital editing systems can apply filters to modify the appearance of digital images or add an object portrayed in a first digital image to a second digital image.

Although conventional digital editing systems have progressed in recent years, they still have several significant shortcomings. For example, conventional digital editing systems can apply filters or add an object to a digital image, but struggle to generate modified digital images that reflect realistic appearance models for a variety of different target image properties. To illustrate, conventional digital editing systems can apply a filter to a digital image, but struggle to modify a material of an object portrayed in a digital image such that the material accurately reflects the environment of the digital image (e.g., reflects the new material as if placed in the illumination environment of the original digital image). Similarly, although conventional digital editing systems can add or remove an object from a digital image, such systems do not accurately modify an object portrayed in a digital image such that the modified object reflects the environment of the digital image (e.g., the modified object appears as if placed in the illumination environment of the original digital image). Moreover, although conventional digital editing systems can modify a color or appearance of a digital image, such systems typically do not modify an illumination environment of the digital image such that objects portrayed in the digital image change to accurately reflect the modified illumination environment.

Some conventional systems have sought to address these problems, but each introduce their own limitations and concerns. For example, some digital image decompositions systems seek to identify and modify physical properties of scenes portrayed in a digital image by making simplifying assumptions regarding the digital image. For example, some digital image decomposition systems assume geometry of objects portrayed in digital images, assume material properties of objects portrayed in digital images (e.g., assume diffuse materials), or assume lighting conditions (e.g., low frequency lighting) to reduce the complexity of decomposing physical properties portrayed in a digital image. Such simplifying assumptions may allow for increased ability to identify physical properties and modify a digital image, but they also introduce inaccuracies and limit the circumstances in which such systems apply.

In addition, some digital image categorization systems leverage machine learning processes to edit digital images. However, these solutions also introduce their own shortcomings. For example, digital image editing systems that utilize machine learning are generally limited to modeling diffuse materials only (i.e., such systems cannot operate with specular materials). In addition, digital image editing systems are often unable to operate in conjunction with advanced material properties, which are generally not differentiable, and impose difficulties in training neural networks. Similarly, digital image categorization systems that utilize machine learning to infer properties from a digital image generally represent these properties in a latent feature space of the neural network. Thus, although such systems can edit digital images, they cannot easily manipulate physical properties because such properties are intrinsically represented as latent features (or otherwise combined) within layers of the neural network.

These and other problems exist with regard to digital image editing.

BRIEF SUMMARY

One or more embodiments of the present disclosure provide benefits and/or solve one or more of the foregoing or other problems in the art with systems and methods that generate a modified digital image by utilizing a neural network that includes a rendering layer. In particular, in one or more embodiments, the disclosed systems and methods utilize a neural network with a rendering layer trained to explicitly model the image formation process based on physical properties portrayed in an input digital image. For example, in one or more embodiments, the disclosed systems and methods provide an input digital image to a neural network, which predicts intrinsic properties of the digital image (e.g., material properties, illumination, and/or surface orientations). The disclosed systems and methods then utilize a trained rendering layer to generate a modified digital image based on these intrinsic properties. Specifically, the disclosed systems and methods replace one or more predicted physical properties with one or more target properties and utilize the rendering layer to generate modified digital images. In this manner, the disclosed systems and methods generate accurate, realistic modified digital images that reflect physical properties of an input digital image and one or more target properties.

To illustrate, in one or more embodiments, the disclosed systems and methods receive an input digital image portraying an object within an illumination environment, where the object portrays a surface of a material aligned at a normal direction. The disclosed systems and methods receive a request to modify a property of the input digital image (i.e., a request to modify the material, the surface orientation, or the illumination environment). The disclosed systems and methods predict intrinsic properties of the digital image (e.g., a material property set, a surface orientation map, and/or an illumination environment map) utilizing the neural network, and then replace one or more of the intrinsic properties with the modified property. The disclosed systems and methods then provide the modified property together with the unmodified intrinsic properties to a rendering layer of the neural network which generates a modified digital image reflecting the modified properties.

By utilizing a neural network with a rendering layer that models the image formation process (e.g., generates a modified digital image based on predicted material properties, surface orientations, and illumination), the disclosed systems and methods generate an accurate modified digital image that portrays a modified material, modified object, or modified illumination environment. Thus, for example, the disclosed systems and methods can change a material of an object from a dull metal to a reflective metal while still portraying the shape and illumination environment portrayed in an input digital image. Similarly, the disclosed systems and methods can modify object shape (e.g., change a car to a truck) and/or illumination environment (e.g., change illumination environment from midday to dusk) in generating a modified digital image while still realistically portraying other physical properties of the input digital image.

Further, the disclosed systems and methods generate modified digital images without making assumptions that limit robust application to a variety of circumstances. Indeed, the disclosed systems and methods need not make assumptions regarding particular geometric shapes or materials in generating a modified digital image. Moreover, because the disclosed systems expressly model physical properties of an input digital image, the disclosed systems and methods replace and modify those physical properties for utilization within a neural network to generate a modified digital image.

In addition, in one or more embodiments, the disclosed systems and methods consider advanced material properties (e.g., bidirectional reflectance distribution functions) by utilizing a parametric material representation that is differentiable with respect to light direction and material properties (e.g., material parameters or material coefficients). This approach allows the disclosed systems and methods to operate with regard to a wide variety of materials, objects, and environments. For example, the disclosed systems and methods are not limited to diffuse materials, but can also model specular materials, resulting in more realistic appearance models. Furthermore, utilizing a differentiable parametric representation allows the disclosed systems and methods to be implemented into a variety of network architectures because the parametric representation allows for back propagation approaches during training. Accordingly, the disclosed systems and methods allow for more efficient training of accurate neural networks for generating modified digital images.

Additional features and advantages of one or more embodiments of the present disclosure will be set forth in the description which follows, and in part will be obvious from the description, or may be learned by the practice of such example embodiments.

BRIEF DESCRIPTION OF THE DRAWINGS

The detailed description is described with reference to the accompanying drawings in which:

FIGS. 6A-6B illustrate an array comprising a plurality of modified digital images generated from a plurality of original digital images in accordance with one or more embodiments;

DETAILED DESCRIPTION

Figure 1:
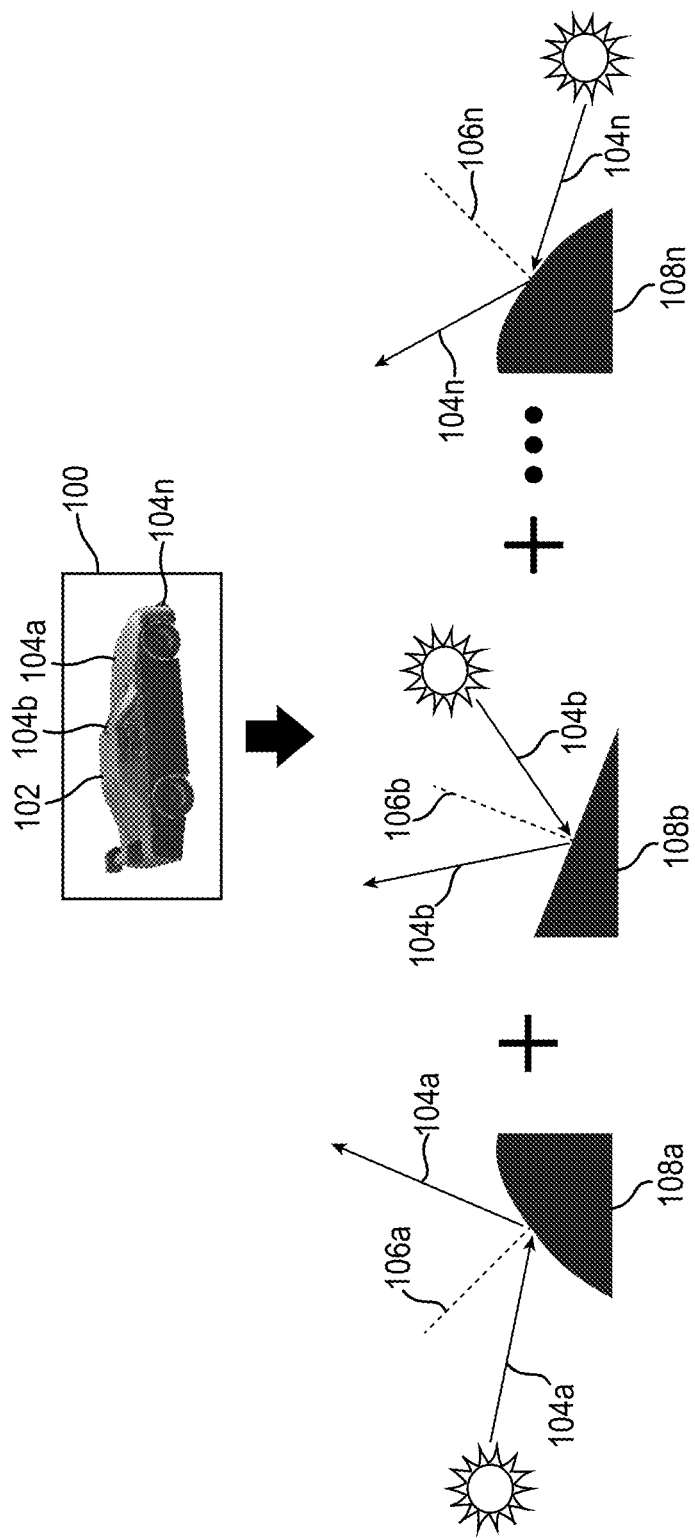
FIG. 1 illustrates a representation of physical properties utilized to model a digital image in accordance with one or more embodiments.

One or more embodiments of the present disclosure include a digital neural network rendering system that generates modified digital images utilizing a neural network with a rendering layer. In particular, in one or more embodiments, the digital neural network rendering system utilizes a neural network with a rendering layer that replicates image formation within the neural network. Specifically, in one or more embodiments, the neural network predicts physical properties reflected in an input digital image, modifies one or more of the physical properties, and utilizes the rendering layer to generate a modified digital image.

To illustrate, one or more embodiments train a neural network with a rendering layer to generate synthesized digital images. Moreover, in response to receiving an input digital image, the digital neural network rendering system utilizes the neural network to predict one or more properties of the input digital image (e.g., a material property set, a surface orientation map, or an illumination environment map of the input digital image). The digital neural network rendering system then replaces one of the predicted properties with a target property (e.g., replace the material property set with a target material property set). Moreover, the digital neural network rendering system utilizes the rendering layer of the neural network to generate a modified digital image from the input digital image that reflects the target property.

By utilizing a neural network with a rendering layer that models image formation from physical properties, the digital neural network rendering system can remedy many problems associated with conventional digital editing systems. For example, the digital neural network rendering system can generate modified digital images that accurately reflect target properties in conjunction with existing physical properties from the input digital image. To illustrate, the digital neural network rendering system can generate a modified digital image that accurately reflects a modified material within an existing illumination environment from the input digital image. Similarly, the digital neural network rendering system can generate a modified digital image that accurately reflects a new object in an illumination environment from the input digital image. Moreover, the digital neural network rendering system can generate a modified digital image that accurately reflects an existing object from an input digital image in a different illumination environment.

Furthermore, unlike some conventional systems that utilize networks, the digital neural network rendering system does not treat the neural network as a black-box in relation to physical properties of digital images. Rather, in one or more embodiments, the digital neural network rendering system expressly models intrinsic physical properties from an input digital image (e.g., material properties, surface orientations, and/or illumination environment). Accordingly, the digital neural network rendering system can more accurately modify properties of an input digital image and utilize a rendering layer to synthesize a modified digital image. Thus, the digital neural network rendering system can provide an end-to-end neural network architecture with a rendering layer that replicates a forward image formation process to identify intrinsic physical properties of an image, modify one or more of the intrinsic physical properties, and generate a modified digital image.

Modeling the image formation process utilizing a rendering layer can also improve efficiency of training neural networks. For example, in one or more embodiments, the digital neural network rendering system trains a neural network by expressly measuring loss based on inaccuracies in physical properties predicted by the neural network. Moreover, the digital neural network rendering system trains the neural network by measuring loss based on inaccuracies in target images generated by the neural network. Accordingly, by expressly modeling physical properties, the digital neural network rendering system can more efficiently train the neural network to generate accurate modified digital images reflecting target properties.

In addition, in one or more embodiments, the digital neural network rendering system also considers advanced material properties, which increases the realistic appearance of resulting modified digital images. For example, in one or more embodiments, the digital neural network rendering system utilizes a parametric material representation that is differentiable with respect to incoming light directions, outgoing light directions, and material properties portrayed in the digital image. Utilizing a parametric material representation that is differentiable allows the digital neural network rendering system to more easily train the neural network. For example, the digital neural network rendering system can utilize back propagation techniques to train a neural network utilizing the parametric material representation.

In addition, utilizing advanced material properties also allows the digital neural network rendering system to generated modified digital images in relation to a variety of different materials. For example, in one or more embodiments, the digital neural network rendering system utilizes a parametric representation based on bidirectional reflectance distribution functions. Utilizing this approach, unlike conventional systems, the digital neural network rendering system can generate modified digital images that reflect diffuse and/or specular materials.

Moreover, in one or more embodiments, the digital neural network rendering system more accurately and realistically portrays illumination in modified digital images by utilizing an illumination environment map. In particular, in one or more embodiments, the digital neural network rendering system utilizes an illumination environment map that more accurately reflects natural illumination of a scene portrayed in a digital image. Specifically, the digital neural network rendering system utilizes an illumination environment map that comprises a spherical panorama image flattened to a two-dimensional domain, where the position of each pixel reflects an incoming light direction in three-dimensional space and the value of each pixel stores the intensity of light coming from the corresponding direction. Such an illumination environment map provides an advanced representation of illumination and allows the digital neural network rendering system to more accurately model existing or target illumination properties in modified digital images.

As mentioned above, in one or more embodiments, the digital neural network rendering system trains a neural network that includes a rendering layer. In particular, in one or more embodiments, the digital neural network rendering system trains a neural network and rendering layer based on loss measures that compare predicted output of the neural network with ground truth training data. For example, in one or more embodiments, the digital neural network rendering system provides a training input image to a neural network and the neural network predicts intrinsic properties of the training image (e.g., a material property set, a surface orientation map, and/or an illumination environment map). The digital neural network rendering system then determines a loss measure by comparing the predicted intrinsic properties with known training properties corresponding to the training input image. Moreover, the digital neural network rendering system utilizes the loss measure to train the neural network to more accurately predict intrinsic properties (e.g., via loss back-propagation techniques).

In addition, in one or more embodiments, the digital neural network rendering system trains the neural network with a rendering layer by generating one or more synthesized digital images. In particular, the digital neural network rendering system can utilize the neural network rendering layer to generate a synthesized training image based in the predicted intrinsic properties of the training input image. The digital neural network rendering system then determines a measurement of loss by comparing the synthesized training image generated by the neural network rendering layer with the training input image. Moreover, the digital neural network rendering system can utilize the loss measure to train the neural network to more accurately generate synthesized digital images based on predicted intrinsic properties.

Furthermore, in one or more embodiments, the digital neural network rendering system trains the neural network with a rendering layer be generating one or more synthesized target images. In particular, the digital neural network rendering system replaces one of the predicted intrinsic properties of the training input image with a training target property corresponding to a training target image. The digital neural network rendering system then utilizes the rendering layer to generate a synthesized target image. In addition, the digital neural network rendering system can determine a measure of loss by comparing the synthesized target image with the training target image. Moreover, the digital neural network rendering system utilizes the loss measure to train the neural network to more accurately generate modified digital images based on modified properties.

Upon training the neural network, the digital neural network rendering system utilizes the neural network to generate modified digital images. Indeed, as mentioned above, the digital neural network rendering system can receive an input digital image and utilize the neural network to predict intrinsic properties of the input digital image. Moreover, the digital neural network rendering system can replace intrinsic properties of the input digital image with target properties and utilize the rendering layer to generate a modified digital image.

Turning now to FIG. 1, additional detail will be provided regarding modeling (e.g., decomposing and/or synthesizing) a digital image in accordance with one or more embodiments of the digital neural network rendering system. In particular, FIG. 1 illustrates a digital image 100 portraying an object 102. As used herein, the term "digital image" refers to any digital symbol, picture, icon, or illustration. For example, the term "digital image" includes digital files with the following, or other, file extensions: JPG, TIFF, BMP, PNG, RAW, or PDF. The term "digital image" also includes one or more images (e.g., frames) in a digital video. Accordingly, although much of the description herein is phrased in terms of digital images, it will be appreciated that the disclosure can also apply to editing digital video utilizing a neural network with a rendering layer.

Moreover, as used herein, the term "object" refers to a person, place, or thing portrayed in a digital image. For example, in relation to FIG. 1, the term "object" includes a car. It will be appreciated, however, that the term object can include any variety of other items, such as a human, an animal, or a structure.

The digital image 100 portrays the object 102 based on light captured by a camera. In particular, the digital image 100 portrays the object 102 as a result of different surfaces of the object 102 aligned in different directions and made of one or materials, reflecting light from an illumination environment into a camera lens that captures the digital image 100. Thus, the digital image 100 can be modeled as a collection of individual light rays forming pixels that vary in appearance as a result of the illumination environment (that produces the light), the materials (that reflect the light differently), and surface orientations (that refract the light in different directions).

As used herein, the term "illumination environment" refers to lighting within a space. In particular, the term "illumination environment" refers to a representation of lighting within a three-dimensional space that makes one or more objects visible to a camera. Moreover, as used herein, the term "material" refers to matter from which an object is made. For example, the car of the object 102 portrayed in the digital image 100 comprises a metallic material. Similarly, as used herein, the term "surface orientation" refers to a bearing describing the alignment of a surface. The term "surface orientation" includes a surface normal direction describing a direction perpendicular to the plane of a surface.

In one or more embodiments, the digital neural network rendering system decomposes digital images and/or synthesizes digital images by modeling the interplay of these intrinsic properties. As used herein the term "properties," "intrinsic properties," or "physical properties" refers to a representation of natural qualities, characteristics, parameters, forces, or factors that contribute to the appearance of one or more pixels in a digital image. In particular, the intrinsic or physical properties includes natural qualities within an environment that impact the appearance of light reflected as pixels in a digital image. For example, physical properties include an illumination environment, materials, and/or surface orientations. As discussed in greater detail below, properties can also include an illumination environment map, a material property set, and/or an object orientation map.

In particular, as shown in FIG. 1, the digital neural network rendering system can decompose (and/or generate) the digital image 100 by modeling a plurality of light rays 104$a$-104$n$ that correspond to the pixels represented in the digital image 100. For example, in relation to the light ray 104$a$, the digital neural network rendering system can model a corresponding pixel in the digital image 100 based on the incoming direction of the light ray 104$a$, based on a material 108$a$ that refracts the light ray 104$a$, based on a surface normal 106$a$ (i.e., the direction perpendicular to the surface where the light ray 104$a$ reflects), and based on the outgoing direction of the light ray 104$a$. Indeed, based on information regarding the directions of the plurality of light rays 104$a$-104$n$, surface normal directions 106$a$-106$n$, and materials 108$a$-108$n$, the digital neural network rendering system can re-create the digital image 100.

Moreover, as mentioned above, the digital neural network rendering system can also determine these intrinsic properties of the digital image 100. In particular, in one or more embodiments, the digital neural network rendering system decomposes the digital image 100 by predicting the incoming directions of the plurality of light rays 104$a$-104$n$, the surface normal directions 106$a$-106$n$, and the materials 108$a$-108$n$. More specifically, as discussed in greater detail below, the digital neural network rendering system can determine an illumination environment map, a surface orientation map, and a material property set that reflect the incoming directions of the plurality of light rays 104$a$-104$n$, the surface normal directions 106$a$-106$n$, and the materials 108$a$-108$n$.

Furthermore, the digital neural network rendering system can generate a modified digital image by modifying these physical properties. For example, the digital neural network rendering system can change the materials 108$a$-108$n$ to modified materials, and generate a modified object within the same illumination environment (e.g., a car made of a different material that appears as if it where illuminated in the same space as the digital image 100). More specifically, the digital neural network rendering system can utilize a neural network to decompose the digital image (i.e., identify intrinsic physical properties of input digital images) and then utilize a rendering layer of the neural network to synthesize properties in generating a modified digital image.

Figure 2:
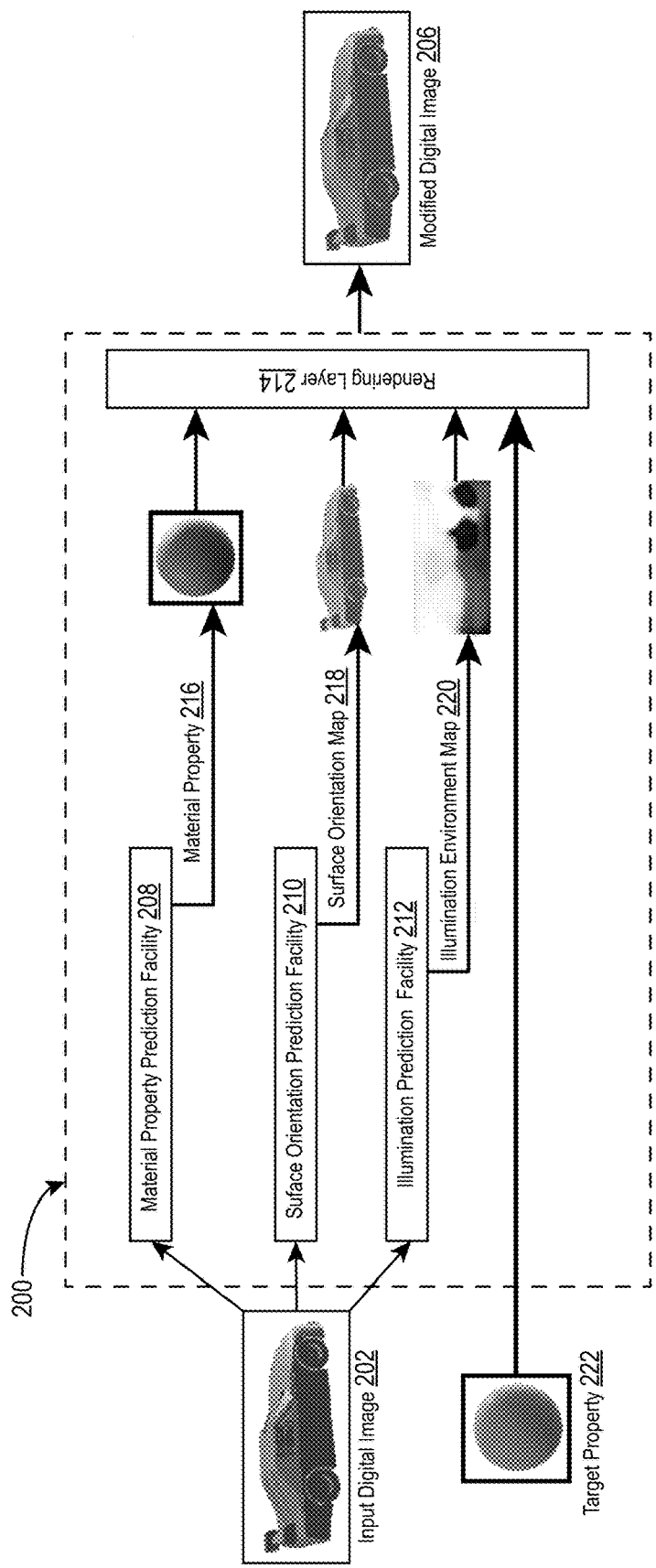
FIG. 2 illustrates a representation of generating a modified digital image utilizing a neural network that includes a rendering layer in accordance with one or more embodiments.

For example, FIG. 2 illustrates utilizing a neural network with a rendering layer to generate a modified digital image. Specifically, FIG. 2 illustrates a neural network 200, an input digital image 202, and a modified digital image 206. As shown, the digital neural network rendering system can provide the input digital image 202 to the neural network 200 and the neural network can generate the modified digital image 206.

As used herein, the term "input digital image" refers to a digital image provided to a neural network. In particular, the term "input digital image" includes a digital image provided to a neural network to generate a modified digital image. Moreover, as used herein, the term "neural network" refers to a machine learning model that can be tuned (e.g., trained) based on inputs to approximate unknown functions. In particular, the term "neural network" can include a model of interconnected layers that communicate and analyze attributes at varying degrees of abstraction to learn to approximate complex functions and generate outputs based on a plurality of inputs provided to the model. For instance, the term "neural network" includes one or more machine learning algorithms. In particular, the term "neural network" includes deep convolutional neural networks (i.e., "CNNs") and fully convolutional neural networks (i.e., "FCNs"). In other words, a neural network includes an algorithm that implements deep learning techniques, i.e., machine learning that utilizes a set of algorithms to attempt to model high-level abstractions in data. Additional detail regarding exemplary neural networks and corresponding network architectures are provided below (e.g., in relation to FIGS. 5A-5C).

As shown, the neural network 200 comprises a material property prediction facility 208, a surface orientation prediction facility 210, an illumination prediction facility 212, and a rendering layer 214. In response to receiving the input digital image 202, the material property prediction facility 208, the surface orientation prediction facility 210, and the illumination prediction facility 212 can determine a material property set 216, a surface orientation map 218, and an illumination environment map 220, respectively.

As used herein, the term "rendering layer" refers to a portion of a neural network for generating a digital image based on physical properties. In particular, the term "rendering layer" includes one or more layers of a neural network for synthesizing physical properties to generate a digital image. In addition, the term "rendering layer" includes a portion of a neural network that models the image formation process based on intrinsic physical properties of a digital image. For example, a rendering layer can generate a digital image based on a material property set, a surface orientation map, and/or an illumination environment map.

As used herein, the term "material property set" (or "material properties") refers to a collection of properties corresponding to a material. In particular, the "material property set" can include a collection of properties (e.g., material parameters or material coefficients) that influence how light rays refract upon contacting a material. For example, a material property set can comprise a plurality of material parameters, such as shadow-casting, multiple scattering, mutual shadowing, transmission, reflection, absorption, emission by surface elements, facet orientation distribution, and facet density.

In one or more embodiments, the digital neural network rendering system determines reflectance of a material based on bidirectional reflectance distribution functions (i.e., BRDFs). For example, in relation to FIG. 2, the digital neural network rendering system utilizes BRDFS to generate the material property set 216 via the material property prediction facility 208. BRDFs provide the ratio of the reflected radiance to the incident radiance of a material given incoming and outgoing light directions.

A material property set can comprise a variety of number and types of properties. For example, in one or more embodiments, the digital neural network rendering system utilizes 108 parameters for a given material. For example, in relation to FIG. 2, the material property set 216 comprises 108 parameters (although the material property set 216 can include greater or fewer parameters).

Moreover, as used herein, the term "surface orientation map" refers to a digital representation of surface directions portrayed in a digital image. In particular, the surface orientation map includes a digital representation of surface normal directions corresponding to surfaces portrayed by pixels in a digital image. For example, a surface orientation map can include a database, matrix, or image file that encodes three-dimensional orientation of surfaces represented by pixels in a digital image. To illustrate, in relation to FIG. 2 the surface orientation map 218 generated by the surface orientation prediction facility 210 comprises a three-channel surface orientation map. In particular, the surface orientation map 218 comprises an image file where the R, G, B color of each pixel encodes the x, y, and z dimensions of each surface normal direction corresponding to each pixel in the input digital image 202.

Furthermore, as used herein, the term "illumination environment map" refers to a digital representation of an illumination environment portrayed in a digital image. In particular, the term "illumination environment map" includes a representation of light ray directions corresponding to a digital image. For example, in one or more embodiments, an illumination environment map includes a representation of incoming light ray directions corresponding to pixels of a digital image. To illustrate, in relation to FIG. 2, the illumination environment map 220 generated by the illumination prediction facility 212 comprises an image file where the location of each pixel in the image file reflects an incoming light direction in relation to light rays that correspond to pixels in the input digital image 202. More specifically, the illumination environment map 220 comprises a spherical panorama digital image wherein the location of each pixel represents incoming light directions in a three-dimensional space flattened to a two-dimensional image domain. The value of each pixel in the illumination environment map 220 stores the intensity of the light coming from a direction corresponding to the position of the pixel. Accordingly, the illumination environment map 220 reflects the intensity and direction of incoming light rays reflected in the input digital image 202 and allows the digital neural network rendering system to model the illumination environment that created the input digital image 202.

As discussed previously, in one or more embodiments, the digital neural network rendering system can utilize a target property to generate a modified digital image from an input digital image. As used herein, the term "target" refers to modified, altered, or desired. For instance, the term "target property" refers to a modified (or desired) property in comparison to a corresponding property of an input digital image. For example, FIG. 2 illustrates providing a target property 222 to the neural network 200 to generate the modified digital image 206. In particular, the digital neural network rendering system replaces one of the properties predicted by the neural network 200 with the target property 222 (i.e., replaces the material property set 216, the surface orientation map 218, or the illumination environment map 220 with the target property 222). Moreover, the digital neural network rendering system then utilizes the rendering layer 214 to generate the modified digital image 206 based on the target property 222.

For example, the digital neural network rendering system can generate the modified digital image 206 to portray the input digital image 202 with a new material. Specifically, the digital neural network rendering system can replace the material property set 216 with the target property 222, wherein the target property 222 includes a target material property set. The digital neural network rendering system can provide the target property 222 (i.e., the target material property), the surface orientation map 218, and the illumination environment map 220 to the rendering layer 214. Moreover, the rendering layer 214 can generate the modified digital image 206 based on the target property 222 (i.e., the target material property), the surface orientation map 218, and the illumination environment map 220. In this manner, the digital neural network rendering system can generate the modified digital image 206 to display a modified material on the same surfaces and in the same illumination environment as portrayed in the input digital image 202.

In addition to (or in the alternative to) replacing the material property set 216, the digital neural network rendering system can also replace the surface orientation map 218 and/or the illumination environment map 220 with the target property 222. For example, the target property 222 can include a target surface orientation map. The digital neural network rendering system can provide the target property 222 (i.e., the target surface orientation map), the material property set 216, and the illumination environment map 220 to the rendering layer 214 and the rendering layer 214 can generate the modified digital image 206. In such circumstances, the modified digital image 206 would reflect a new object made of the same material within the same illumination environment as the input digital image 202.

Similarly, the target property 222 can comprise a target illumination environment map. For instance, the digital neural network rendering system can provide the target property 222 (i.e., the target illumination map), the material property set 216, and the surface orientation map 218 to the rendering layer 214 and the rendering layer 214 can synthesize the modified digital image 206. In such an embodiment, the modified digital image 206 would reflect the same material and object portrayed in the input digital image 202, but within a different illumination environment (e.g., a shiny car at night rather than a shiny car at noon).

The digital neural network rendering system can replace one or more of the properties generated by the neural network 200 with one or more target properties to generate a modified digital image. Thus, although the foregoing examples illustrate replacing a single predicted property with a single target property, the digital neural network rendering system can replace multiple determined properties with multiple target properties. For example, the digital neural network rendering system can replace the material property set 216 and the illumination environment map 220 with a target material property set and a target illumination map to generate the modified digital image 206. In this manner, the digital neural network rendering system can generate a modified digital image that reflects the same object, but made of a different material within a different illumination environment.

In addition to utilizing target properties, in one or more embodiments the digital neural network rendering system also generates target properties. For example, the digital neural network rendering system can generate target properties from a second digital image. To illustrate, the digital neural network rendering system can provide a second digital image to the neural network 200. The neural network can generate a second material property set, a second surface orientation map, and/or a second illumination environment map corresponding to the second digital image. The digital neural network rendering system can then utilize the second material property set, the second surfaced orientation map, and/or the second illumination environment map as the target property 222.

In this manner, the digital neural network rendering system can allow users to mix and match different properties from different digital images in generating modified digital images. For example, a user may like the orientation or arrangement of an object in a first digital image, but like the lighting from a second digital image. The digital neural network rendering system can replace an illumination environment map corresponding to the first digital image with an illumination environment map corresponding to the second digital image and utilize the rendering layer 214 to generate a modified digital image with the orientation of the object from the first digital image and the illumination environment from the second digital image.

Furthermore, in one or more embodiments, the digital neural network rendering system allows users to select a target property. For example, in one or more embodiments, the digital neural network rendering system provides a user interface for display with user interface elements indicating different target properties (or digital images reflecting target properties). In response to user selection of one or more of the target properties (or digital images reflecting the target properties), the digital neural network rendering system can generate a modified digital image utilizing the target properties.

As mentioned previously, the digital neural network rendering system can efficiently utilize (and train) a neural network with a rendering layer by utilizing differentiable parametric representations. In particular, the digital neural network rendering system can utilize differentiable parametric representations to solve for material property sets, illumination environment maps, and surface orientation maps. This allows the digital neural network rendering system to accurately generate modified digital images for a wide range of materials, objects, and illumination environments.

For example, as mentioned previously, in one or more embodiments, the digital neural network rendering system utilizes advanced material properties to generated modified digital images. In particular, in one or more embodiments, the digital neural network rendering system utilizes BRDFs to model materials. A bidirectional reflectance distribution function gives the ratio of the reflected radiance to the incident irradiance of a material given incoming and outgoing light directions. For example, additional detail regarding bidirectional reflectance distribution functions is provided in F. E. Nicodemus, J. C. Richmond, J. J. Hsia, I. W. Ginsberg, and T. Limperis, RADIOMETRY, *Geometrical Considerations and Nomenclature for Reflectance*, 94-145 (Jones and Bartlett Publishers, Inc. 1992), which is incorporated herein by reference in its entirety.

However, different bidirectional reflectance distribution functions apply to different materials with different material properties. Accordingly, a collection of bidirectional reflectance distribution functions (i.e., "BRDFs") are required to model a variety of different materials. Indeed, in one or more embodiments, the digital neural network rendering system utilizes a plurality of bidirectional reflectance distribution functions stored in data, for example, as a look up table, matrix, or database. To illustrate, in one or more embodiments, the digital neural network rendering system utilizes the MERL BRDF database.

However, such discrete functions stored in a look up table, matrix, database, or other data structure are not differentiable, and thus cannot be efficiently utilized to generated modified digital images or train a neural network. Accordingly, in one or more embodiments the digital neural network rendering system generates a parametric function that is differentiable based on a BRDF database. In particular, the digital neural network rendering system can utilize a directional statistics BRDF model that represents each BRDF as a combination of hemispherical exponential power distributions. Indeed, in one or more embodiments, the digital neural network rendering system applies the directional statistics BRDF model described in K. Nishino, *Directional Statistics BRDF Model*, 2009 IEEE 12TH INTERNATIONAL CONFERENCE ON COMPUTER VISION, 476-483 (IEEE 2009), which is incorporated herein by reference. This approximation represents each material as a linear combination of PCA basis computed over the MERL BRDF database. Moreover, the digital neural network rendering system formulates this model such that it is differentiable with respect to incoming directions of light rays, outgoing directions of light rays and different material properties.

The digital neural network rendering system can approximate material property sets based on these distributions. For example, experimenters have determined that utilizing three hemispherical exponential power distributions provides accurate approximations, resulting in 108 parameters per material in total. Moreover, as just mentioned these distributions are differentiable parametric representations that the digital neural network rendering system can utilize to identify parameters corresponding to a material (i.e., material property set). In this manner, the digital neural network rendering system can generate a parametric representation of BRDFs that is differentiable with respect to incoming and outgoing light directions and material properties (i.e., parameterization of the material definition). Moreover, the digital neural network rendering system can implement the parametric representation in conjunction with a neural network to determine a material property set corresponding to an input digital image and generate modified digital images.

The digital neural network rendering system can also support other parametric representations. For example, the digital neural network rendering system can also utilize the Cook-Torrance model (i.e., the Cook-Torrance BRDF). Moreover, the digital neural network rendering system can also represent each material as a linear combination of MERL BRDFs. Regardless of the particular form, the digital neural network rendering system can utilize parametric representations that are differentiable to generate modified digital images.

In addition, by utilizing BRDFs the digital neural network rendering system can accurately model both diffuse and specular materials. As used herein, the term "diffuse material" refers to a material having a rough surface that reflects light in many different directions. In particular, the term "diffuse material" includes a material that reflects light such that the apparent brightness is the same regardless of an observer's angle of view. For example, diffuse materials include unfinished wood, concrete, brick or woolen clothing. The term "specular material" refers to a material having a smooth surface that reflects light in the same direction. The term "specular material" includes a material that reflects light such that brightness changes based on an observer's angle of view. For instance, a specular material reflects light such that a spot of light appears on the object when illuminated (i.e., a spot of light that changes position based on an observer's angle of view). Specular materials include finished wood, a mirror, or polished metal.

By utilizing a parametric material representation of BRDFs, the digital neural network rendering system can operate in conjunction with diffuse materials and/or specular materials. For example, in relation to FIG. 2, the input digital image 202 can portray specular and/or diffuse materials and the digital neural network rendering system can generate the modified digital image 206 such that it portrays specular and/or diffuse materials. Indeed, the digital neural network rendering system can modify a diffuse material to a specular material (or vice versa). Moreover, the digital neural network rendering system can modify an illumination environment for a digital image that portrays a specular material such that the specular material portrays the new illumination environment. Similarly, the digital neural network rendering system can modify an object for a digital image that portrays a specular material such that the new object portrays the specular material.

Figure 3A:
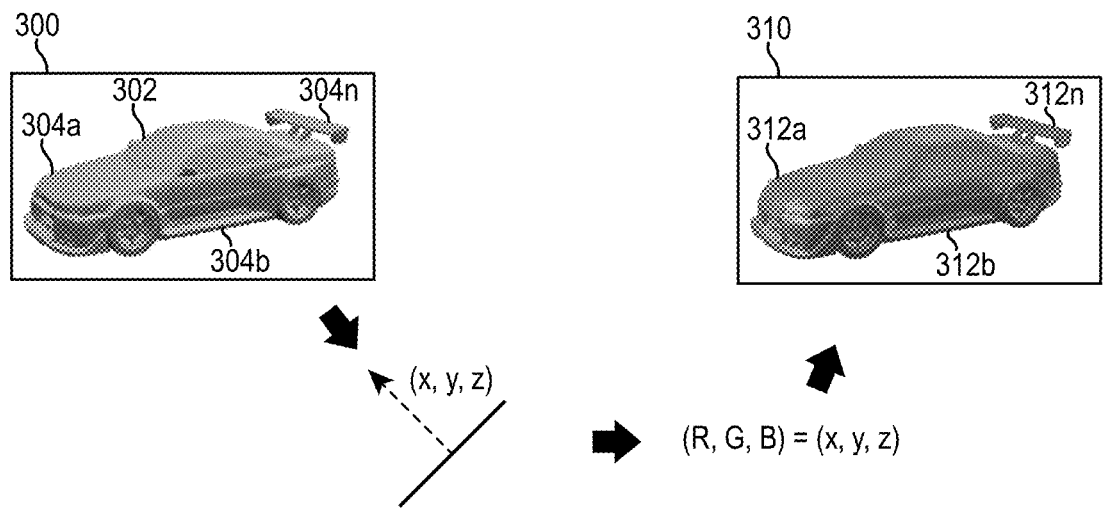
FIGS. 3A-3B illustrate representations of a surface orientation map and an illumination environment in accordance with one or more embodiments.
Figure 3B:
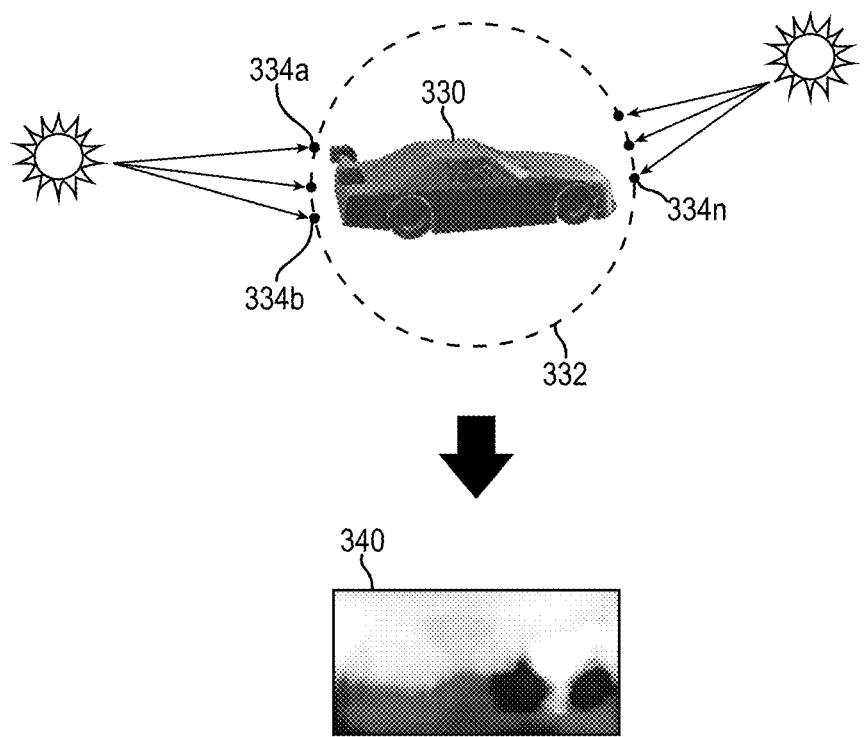

Turning now to FIGS. 3A-3B additional detail will be provided regarding surface orientation maps and illumination environment maps in accordance with one or more embodiments of the digital neural network rendering system. Specifically, FIG. 3A illustrates an input digital image 300 portraying an object 302 and a surface orientation map 310 corresponding to the input digital image 300. As illustrated, the object 302 is represented as a plurality of pixels 304a-304n in the input digital image 300. Moreover, each of the plurality of pixels 304a-304n corresponds to a plurality of surfaces having different orientations.

As mentioned previously, in one or more embodiments, the digital neural network rendering system represents a surface orientation map as a digital image where the color of the digital image corresponds to the orientation of surfaces portrayed in an input digital image. For example, FIG. 3A illustrates the surface orientation map 310. The surface orientation map 310 is a digital image that portrays the object 302 as a plurality of pixels 312a-312n. Each of the pixels 312a-312n correspond to the pixels 304a-304n. In particular, as shown, the digital neural network rendering system generates the surface orientation map 310 by determining a normal direction for each surface portrayed by the pixels 304a-304n. The digital neural network rendering system then generates the color of each pixel 312a-312n in the surface orientation map 310 based on the normal direction. Specifically, as shown in FIG. 3A, the digital neural network rendering system populates each R, B, G value for the pixels 312a-312n in the surface orientation map with the x, y, z coordinates of the surface normal direction of the corresponding pixel in the input digital image 300.

In addition to a surface orientation map, the digital neural network rendering system can also utilize an illumination environment map to generate a modified digital image. In particular, as discussed above, the digital neural network rendering system can utilize an illumination environment map comprising a spherical panorama digital image that encodes the intensity of incoming light from different directions. As used herein, the term "spherical panorama digital image" refers to a digital image that portrays an enlarged field of view. In particular, the term "spherical panorama digital image" refers to a digital image that include a field of view that extends beyond a field of view of the human eye. For example, the term "spherical panorama digital image" includes a panorama digital image that reflects 360 degrees of a horizontal field of view.

For example, FIG. 3B illustrates an object 330 portrayed in a digital image and a corresponding illumination environment map 340. In relation to the embodiment of FIG. 3B, the illumination environment map 340 reflects a two-dimensional representation of a three-dimensional spherical panorama digital image. In particular, the digital neural network rendering system models the illumination environment map 340 as a sphere 332 surrounding the object 330. As shown, the sphere 332 intersects incoming light rays 334a-334n. Accordingly, as illustrated, the digital neural network rendering system can model the incoming direction of each of the light rays 334a-334n as a position on the sphere 332. Indeed, the position on the sphere indicates the direction of the light ray in relation to the object 330. Moreover, the digital neural network rendering system can encode the intensity of each light ray.

Accordingly, the digital neural network rendering system can map the position of each of the light rays 334a-334n on the sphere 332 and their intensity to a spherical panorama digital image. The position of each pixel in the spherical panorama digital image reflects a direction of incoming light rays. Moreover, the value of each pixel in the spherical panorama digital image reflects the intensity of light rays from a particular direction.

As shown in FIG. 3B, the digital neural network rendering system can also convert a spherical panorama digital image from a three-dimensional space to a two-dimensional image.

Indeed, the illumination environment map 340 reflects the intensity and position of the light rays 334a-334n intersecting the sphere 332 in a two-dimensional digital image.

As mentioned above, utilizing an illumination environment map that comprises a spherical panorama digital image representation of light rays provides a more general, robust, and accurate representation of illumination than previous works. Moreover, utilizing such an illumination environment map in a neural network with a rendering layer provides for more accurate, realistic results in decomposing input digital images and synthesizing modified digital images.

As discussed above, the digital neural network rendering system trains a neural network with a rendering layer to generate a modified digital image. In particular, the digital neural network rendering system trains a neural network to both decompose an input image into intrinsic properties (e.g., a material property set, an illumination environment map, and/or a surface orientation map) and synthesize a digital image based on intrinsic properties. To illustrate, the digital neural network rendering system provides a training input image to a neural network and utilizes the neural network to predict intrinsic properties (e.g., a material property set, a surface orientation map, and/or an illumination environment map). Moreover, the digital neural network rendering system can replace one or more of the intrinsic properties with a training target property corresponding to a training target image. The digital neural network rendering system can utilize a rendering layer of the neural network to generate a synthesized digital training image (corresponding to the input training image) and/or a synthesized target digital image (corresponding to the training target image).

The digital neural network rendering system can then train the neural network by determining and utilizing one or more loss measures (e.g., by back-propagating the neural network with the loss measures to teach the neural network what attributes are significant in generating intrinsic properties and modified digital images). For instance, the digital neural network rendering system can generate a material property loss measure by comparing the predicted material property set with a training material property set corresponding to the training input image. Similarly, the digital neural network rendering system can generate a surface orientation loss by comparing the predicted surface orientation map with a training surface orientation map corresponding to the training input image. Moreover, in one or more embodiments, the digital neural network rendering system can identify an illumination loss by comparing the predicted illumination environment map with a training illumination environment map. Utilizing one or more of these loss measures, the digital neural network rendering system can train the neural network to accurately identify intrinsic properties from an input digital image.

Furthermore, the digital neural network rendering system can determine an input image loss and a target image loss. For instance, in one or more embodiments, the digital neural network rendering system generates an input image loss by comparing the synthesized digital image generated by the rendering layer with the digital input image. Similarly, the digital neural network rendering system can generate a target image loss by comparing a synthesized target image generated by the rendering layer with the training target image. Utilizing these perceptual losses, the digital neural network rendering system can train the neural network to accurately synthesize digital images from various physical properties.

As used herein, the term "training input image" refers to a digital image utilized to train a neural network. For instance, a training input image includes a digital image provided to a neural network and utilized to predict intrinsic properties and/or generate synthesized digital images to train the neural network. As used herein, the term "training material property set" refers to a material property set corresponding to a training input image that is utilized to train a neural network. For example, in one or more embodiments, the training material property set comprises a ground truth representation of material properties portrayed in a training input image. Similarly, as used herein, the term "training surface orientation map" refers to a surface orientation map corresponding to a training input image that is utilized to train a neural network. For example, in one or more embodiments, the training surface orientation map comprises a ground-truth representation of surface orientations portrayed in a training input image. Moreover, as used herein, the term "training illumination environment map" refers to an illumination environment map utilized to train a neural network. For example, a training illumination environment map includes a ground truth representation of an illumination environment portrayed in a training input image.

In addition, as used herein, the term "training target image" refers to a digital image with a modified property. In particular, the term "training target image" includes a training input image that includes a target (i.e., modified) property that is utilized to train a neural network. For example, a training target image includes a training input image that has been modified to reflect a training target property. As used herein, the term "training target property" refers to a modified property of a digital image utilized to train a neural network. As just mentioned, the training target property includes a modified property of a training input image that results in a training target image. For example, a training target property can include a training target material property set, a training target surface orientation map, or a training target illumination environment map.

As used herein, the term "synthesized image" refers to an image generated by a rendering layer of a neural network. For example, the term "synthesized image" includes a digital image generated by a rendering layer of a neural network based on physical properties (i.e., based on a material property set, a surface orientation map, and/or an illumination environment map). Similarly, as used herein, a "synthesized training image" refers to a synthesized image corresponding to a training input image. In particular, a synthesized training image includes a synthesized image generated from the physical properties of a training input image. Along similar lines, a "synthesized target image" refers to a synthesized image corresponding to a training target image (and/or a training target property). In particular, a synthesized target image includes a synthesized image generated from the physical properties of a training target image (i.e., a training target property).

Figure 4:
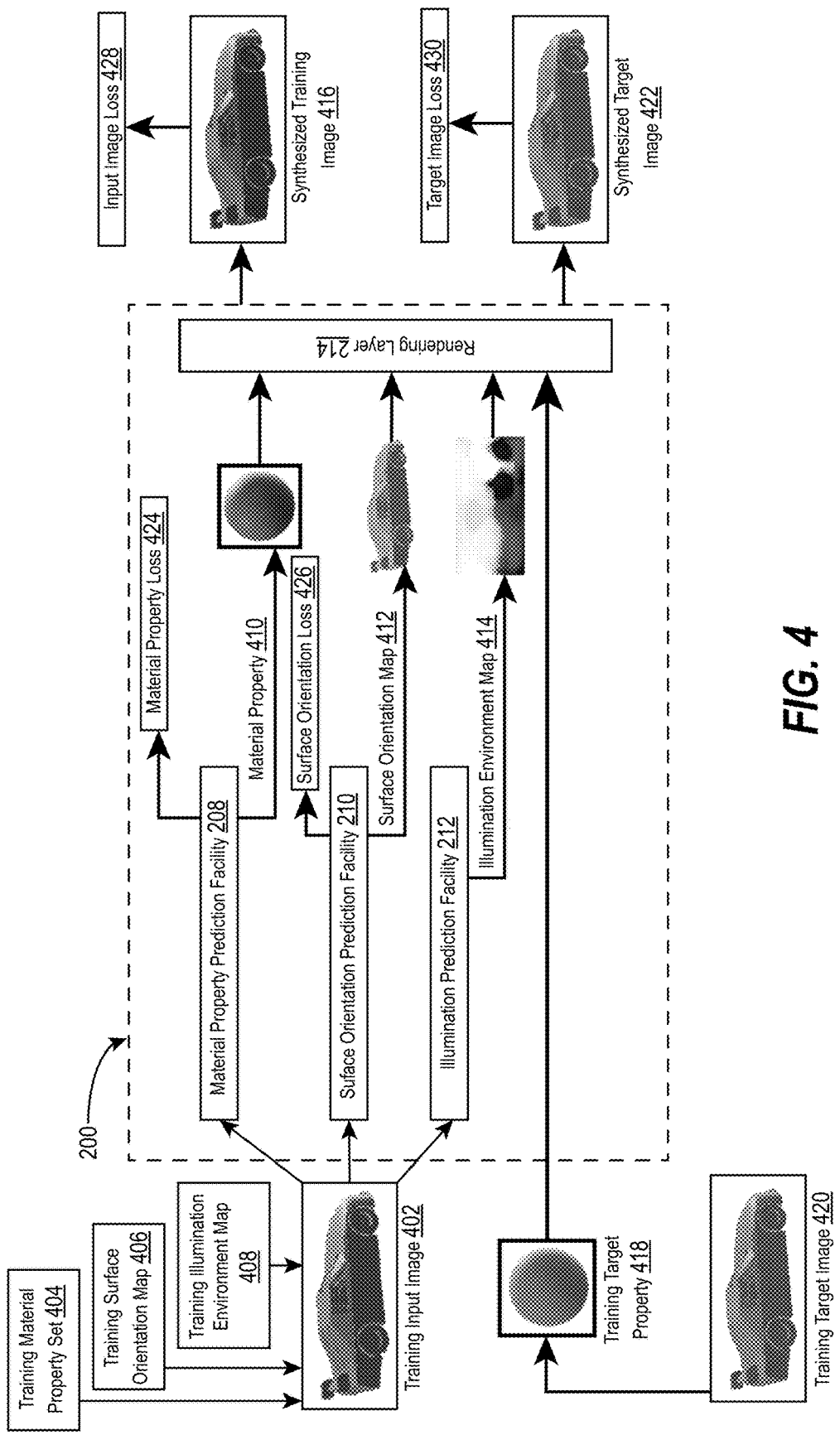
FIG. 4 illustrates a representation of training a neural network that includes a rendering layer in accordance with one or more embodiments.

To illustrate, FIG. 4 shows a representation of training a neural network in accordance with one or more embodiments. As shown, the digital neural network rendering system trains the neural network 200 by utilizing a training input image 402. More specifically, the training input image 402 corresponds to a training material property set 404 (i.e., a ground truth material property set for the training input image 402), a training surface orientation map 406 (i.e., a ground truth surface orientation map corresponding to the training input image 402), and a training illumination environment map 408 (i.e., a ground truth illumination environment map corresponding to the training input image 402). As shown, the digital neural network rendering system provides the training input image 402 to the neural network 200.

Moreover, as illustrated in FIG. 4, the neural network 200 utilizes the material property prediction facility 208, the surface orientation prediction facility 210 and the illumination prediction facility 212 to predict a material property set 410, a surface orientation map 412, and an illumination environment map 414, respectively. Further, the rendering layer 214 utilizes the material property set 410, the surface orientation map 412, and the illumination environment map 414 to generate a synthesized training image 416.

In addition, as mentioned above, the digital neural network rendering system can also generate a synthesized target image that reflects a training target property. For instance, as shown in FIG. 4, the digital neural network rendering system accesses a training target property 418 corresponding to a training target image 420. In particular, the training target image 420 is a digital image modified from the training input image to reflect the training target property. More specifically, the training target image 420 reflects the training input image 402 with one of the physical properties of the training input image replaced by the training target property 418. In relation to the embodiment of FIG. 4, the training target property 418 comprises a training material property set (although in other embodiments, the training target property 418 can include a training surface orientation map and/or a training illumination environment map).

As shown, the digital neural network rendering system provides the training target property 418 to the rendering layer 214. Moreover, the rendering layer 214 generates a synthesized target image 422. Specifically, the digital neural network rendering system generates the synthesized target image 422 by replacing the material property set 410 with the training target property 418. More particularly, the digital neural network rendering system provides the training target property 418 (i.e. a training material property set), the surface orientation map 412, and the illumination environment map 414 to the rendering layer 214 and the rendering layer 214 generates the synthesized target image 422.

As shown in FIG. 4, the digital neural network rendering system can train the neural network 200 by generating one or more loss measures. As used herein, the term "loss measure" refers to a difference between a result generated by a neural network and ground truth. A loss measure can include a variety of loss measures, including a cosine loss (i.e., a cosine distance), an L1 loss, and/or or an L2 normal loss.

For example, as shown in FIG. 4, the digital neural network rendering determines a material property loss 424. In particular, the digital neural network rendering system compares the material property set 410 and the training material property set 404 to determine the material property loss 424. The material property loss 424 thus reflects the difference between the material property set 410 predicted by the material property prediction facility 208 and the training material property set 404 corresponding to the training input image 402.

Similarly, as shown in FIG. 4, the digital neural network rendering system generates a surface orientation loss 426. In particular, the digital neural network rendering system compares the surface orientation map 412 and the training surface orientation map 406 to determine the surface orientation loss 426. The surface orientation loss 426 thus reflects the difference between the surface orientation loss predicted by the surface orientation prediction facility 210 and the training surface orientation map 406 corresponding to the training input image 402.

Moreover, as illustrated in FIG. 4, the digital neural network rendering system also generates an input image loss 428. In particular, the digital neural network rendering system compares the synthesized training image 416 and the training input image 402 to determine the input image loss 428. The input image loss 428 thus reflects the difference between the synthesized training image 416 generated by the rendering layer 214 and the training input image 402.

Furthermore, the digital neural network rendering system also determines a target image loss 430. In particular, the digital neural network rendering system compares the synthesized target image 422 and the training target image 420 to determine the target image loss 430. The target image loss 430 thus reflects the difference between the synthesized target image 422 generated by the rendering layer 214 and the training target image 420.

Upon calculating one or more loss measures, the digital neural network rendering system can then utilize the loss measures to train the neural network 200 (e.g., back-propagate the loss to the neural network 200 so that the neural network 200 can learn to minimize loss). For example, in relation to FIG. 4, the digital neural network rendering system can utilize the material property loss 424 and the surface orientation loss 426 to train the neural network 200 too more accurately predict material property sets and surface orientation maps. Similarly, the digital neural network rendering system can utilize the input image loss 428 and the target image loss 430 to train the neural network to more accurately predict illumination environment maps and to more accurately synthesize digital images and generated modified digital images.

In one or more embodiments, the digital neural network rendering system also generates a combined loss measure. For example, in relation to FIG. 4, the digital neural network rendering system generates a single loss measure by combining the material property loss 424, the surface orientation loss 426, the input image loss 428, and the target image loss 430. Moreover, in one or more embodiments, the digital neural network rendering system weights particular loss measures differently in generating a combined loss measure. For example, in one or more embodiments, the digital neural network rendering system weights the input image loss 428 and the target image loss 430 less heavily than the surface orientation loss 426 and the input image loss 428.

Figure 5A:
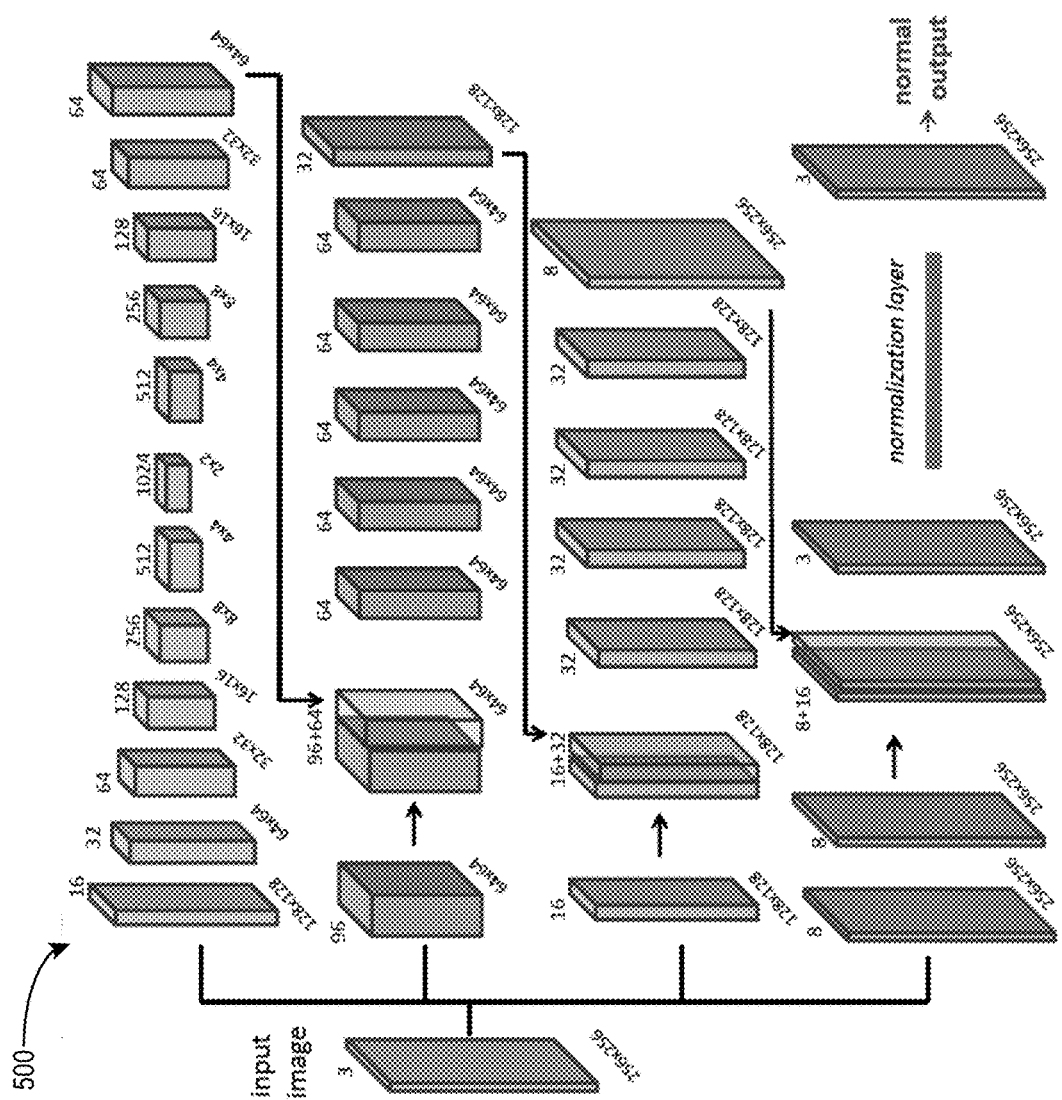
FIGS. 5A-5C illustrate network architectures for predicting physical properties in accordance with one or more embodiments.
Figure 5B:
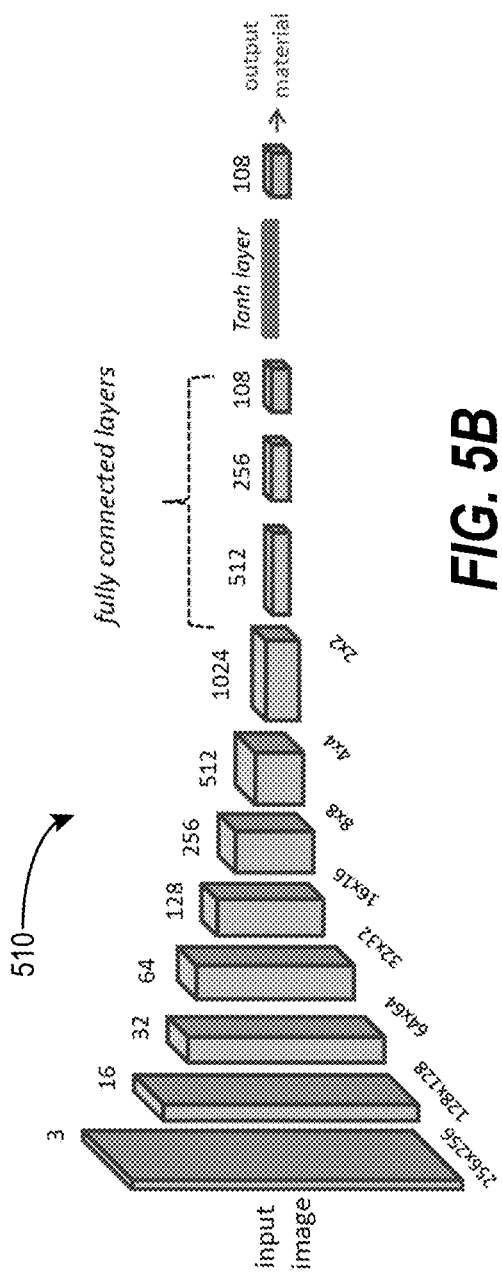
Figure 5C:
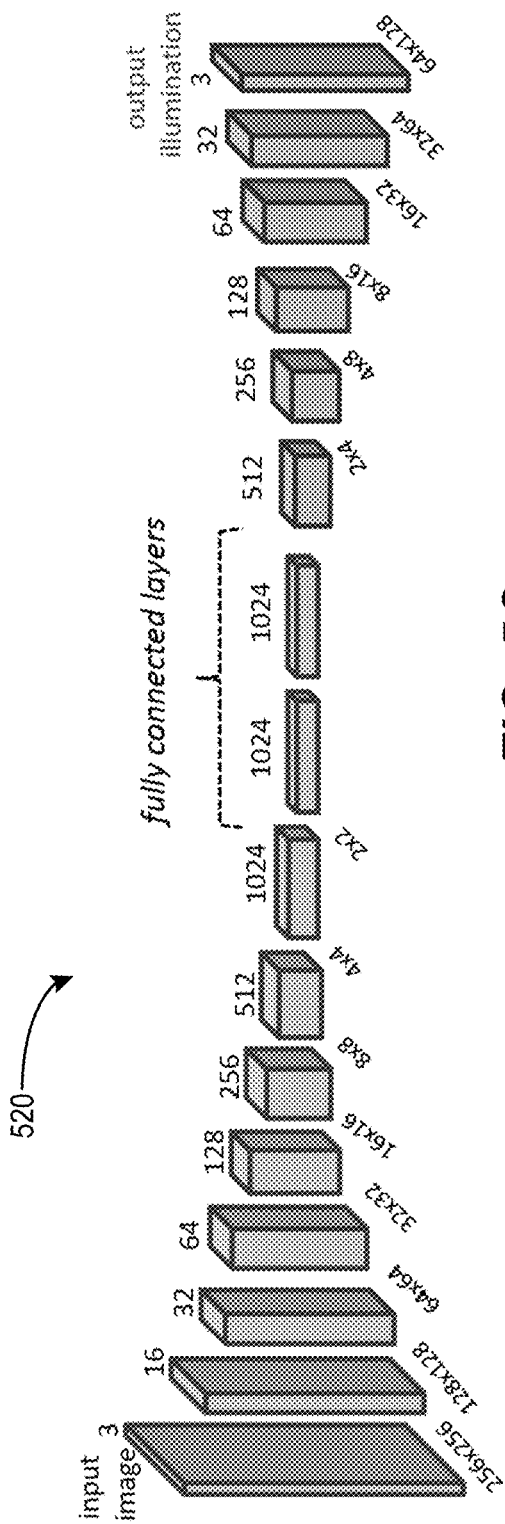

Turning now to FIGS. 5A-5C additional detail will be provided regarding prediction facilities utilized by the digital neural network rendering system as part of a neural network to predict properties of a digital image. Indeed, as described above, a neural network can comprise a plurality of layers that analyze attributes at various levels of abstraction for predicting an outcome. FIGS. 5A-5C illustrate three example architectures comprising various layers for predicting material property sets, surface orientation maps, and illumination environment maps.

In particular, FIG. 5A illustrates an architecture 500 for predicting surface orientation represented in a digital image (e.g., the surface orientation prediction facility 210). In particular, the architecture 500 predicts surface normal directions corresponding to surfaces portrayed in an input digital image. As illustrated, the architecture 500 utilizes an input digital image volume of size 3×256×256 and layers of various dimensionality (dimensions shown) to generate an output prediction of surface normal directions with the same volume as the input digital image.

The digital neural network rendering system utilizes a modified approach to that described by D. Eigen and R. Fergus, *Predicting Depth, Surface Normals and Semantic Labels With a Common Multi-Scale Convolutional Architecture*, IEEE ICCV, 2650-2658 (2015), which is incorporated herein by reference in its entirety. As illustrated, the digital neural network rendering system modifies this approach by predicting a surface orientation map utilizing a 4-scale submodule network (as opposed to the originally proposed 3-scale-submodule network). The fourth submodule consists of two convolutional layers where both input and output size is equal to the size of the input image. The digital neural network rendering system also utilizes a normalization layer to predict surface normal with unit length.

Similarly, FIG. 5B illustrates an architecture 510 for predicting material property sets (e.g., the material property prediction module). As shown, the architecture 510 utilizes an input digital image volume of size 3×256×256. Moreover, the architecture 510 is composed of seven convolutional layers where the output of each layer is half the size of its input. The convolutional layers are followed by three fully connected layers and a tan h layer. Each convolutional and fully connected layer is accompanied by a rectifier linear unit. Fully connected layers are also followed by dropout layers. As described above, in one or more embodiments, the digital neural network rendering system utilizes 108 material parameters. Note that because each of the 108 material parameters are defined at different scale, the digital neural network rendering system can normalize each to the range [−0.95, 0.95] and remap the parameters to the original scales after prediction.

Moreover, FIG. 5C illustrates an architecture 520 for predicting illumination environment maps. As illustrated, the architecture 520 utilizes an input digital image volume of size 3×256×256 and 14 layers of various dimensionality (including two fully connected layers) to generate an output illumination environment map of size 3×64×128. The architecture 520 includes seven convolutional layers where the output of each layer is half the size of its input. The convolutional layers are followed by two fully connected layers and a sequence of deconvolutional layers to generate an illumination environment map of size 64×128. Each convolutional and fully connected layer is accompanied by a rectifier linear unit. Fully connected layers are also followed by dropout layers.

In addition to the foregoing description, training a neural network with a rendering layer and generating a modified digital image utilizing the neural network can also be described in terms of algorithms or pseudocode implemented by one or more computing devices. For example, the following description illustrates equations and algorithms for training and utilizing a neural network to generate a modified digital image reflecting a target property set in accordance with one or more embodiments. For illustration purposes, the following description will describe a target property that comprises a material property set. As described above, however, the digital neural network rendering system can utilize one or more alternative or additional target properties.

Consider an input digital image, $\mathcal{J}$ that portrays an object, s, with a material, m captured in an illumination environment, L. Given a desired material property set, $m_t$ (i.e., a target property), the goal is to synthesize an output image $\mathcal{O}$ that depicts s with material $m_t$ (or another target property) from the same viewpoint and under the same illumination environment.

The digital neural network rendering system models the image formation process via a rendering layer as follows. Given per-pixel surface normal directions n (in camera coordinates), material property set m (i.e., material coefficients or material properties) and illumination environment L, the outgoing light intensity for each pixel p in $\mathcal{J}$ can be written as an integration over all incoming light directions, $\vec{\omega}_i$, as follows:

$$\mathcal{J}_p(n_p, m, L) = \int f(\vec{\omega}_i, \vec{\omega}_p, m) L(\vec{\omega}_i) \max(0, n_p \cdot \vec{\omega}_i) d\vec{\omega}_i \quad \text{(Equation 1)}$$

where $L(\vec{\omega}_i)$ defines the intensity of the incoming light and $f(\vec{\omega}_i, \vec{\omega}_p, m)$ defines how this light is reflected along the outgoing light direction $\vec{\omega}_p$ based on the material properties m. In order to make this formulation differentiable, the digital neural network rendering system can substitute the integral with a sum over a discrete set of incoming light directions defined by the illumination L:

$$\mathcal{J}_p(n_p, m, L) = \Sigma_L f(\vec{\omega}_i, \vec{\omega}_p, m) L(\vec{\omega}_i) \max(0, n_p \cdot \vec{\omega}_i) d\vec{\omega}_i \quad \text{(Equation 2)}$$

where $d\vec{\omega}_i$ represents the contribution (weight) of a single light $\vec{\omega}_i$.

Viewing Direction Representation. The viewing direction is related to the field of view of the camera that captures the digital image and the height, $H_I$, and width, $W_I$, of the digital image. For a pixel, p with row index, $h_I$ and column index, $w_I$, the viewing direction is:

$$\vec{\omega}_p = \left(-\frac{H_I((2h_p - W_I)}{V}, -\frac{W_I((H_I - 2w_p)}{V}, \frac{H_I \cdot W_I}{V}\right)$$

where $V = \sqrt{H_I^2(2w_p - W_I)^2 + W_I^2(H_I - 2h_p)^2 + H_I^2 \cdot W_I^2}$ Note that this lighting direction is only related to the camera parameters, image size, and the position of pixel p. Note that it is not necessary to compute its derivative and there is no parameter to learn during training.

Surface Orientation Representation.

Given an image $\mathcal{J}$ of dimension w×h, n is represented by a 3-channel w×h normal map where the r, g, b color of each pixel p encodes the x, y, and z dimensions of the per-pixel normal $n_p$ (as illustrated in FIG. 3A). The normal for each pixel has 3 channels:

$$n_p = (n_p^0, n_p^1, n_p^2)$$

Illumination Representation.

In relation to this embodiment, the digital neural network rendering system represents illumination with an HDR environment map of dimension 64×128. This illumination environment map is a spherical panorama image flattened to the 2D image domain (as illustrated in FIG. 3B). Each pixel coordinate in this image can be mapped to spherical coordinates and thus corresponds to an incoming light direction $\vec{\omega}_i$ in Equation 2. The pixel value stores the intensity of the light coming from this direction.

Let $H_L$ and $W_L$ represent the height and width of the environment map respectively. For each pixel $i = h \cdot W_L + w$, which has the row index and column index to be $h_L$ and $W_L$, in the environment map, the digital neural network rendering system defines $\theta_i^L$ and $\phi_i^L$ to be:

$$\theta_i^L = \frac{h_L}{H_L}\pi, \phi_i^L = 2 * \frac{w_L}{W_L}\pi$$

Then the direction of the lighting this pixel generates is:

$$\vec{\omega}_i = <\cos \phi_i^L \sin \theta_i^L, \cos \theta_i^L, \sin \phi_i^L \sin \theta_i^L>$$

Note that the digital neural network rendering system need not compute the derivative of $\vec{\omega}_i$ and there is no parameter to learn during the training. Indeed, in one or more embodiments, the digital neural network rendering system utilizes an environment map of fixed size, which results in a set of light directions that are consistant, as defined by the environment map.

Material Representation.

The digital neural network rendering system defines $f(\vec{\omega}_i, \vec{\omega}_p, m)$ based on BRDFs which provide a physically correct description of pointwise light reflections both for diffuse and specular surfaces. Non-parametric models aim to capture the full spectrum of BRDFs via lookup tables. Such lookup tables are computationally expensive and not differentiable. The digital neural network rendering system adopts the Directional Statistics BRDF model, as described above, which is shown to accurately model a wide variety of measured BRDFs. This model represents each BRDF as a combination of hemispherical exponential power distributions and the number of parameters depends on the number of distributions utilized. Experiments indicate that utilizing three distributions provides accurate approximations resulting in 108 parameters per material definition in total.

The digital neural network rendering system defines a half vector to be:

$$\vec{h}_p = \frac{\vec{\omega}_i + \vec{\omega}_p}{\|\vec{\omega}_i + \vec{\omega}_p\|}$$

The digital neural network rendering system then denotes the angle between half vector and lighting direction to be $\theta_d$.

$$\theta_d = a\cos(\min(1, \max(0, \vec{\omega}_i \cdot \vec{h}_p)))$$

The material coefficient is defined over three reflectance lobes ($s \in \{0, 1, 2\}$) for each color channel $k \in \{0, 1, 2\}$). For each reflectance lobe and color channel two functions $m1^{(k,s)}(\theta_d)$ and $m2^{(k,s)}(\theta_d)$ are defined and each function has 6 parameters. This gives in total 3 (R, G, B color channels) *3 (lobes)*2 (functions)*6=108 parameters represented by m. For simplicity we will omit the argument $\theta_d$ to the functions $m1^{(k,s)}$ and $m2^{(k,s)}$ in the rest of the equations. The function $f(\vec{\omega}_i, \vec{\omega}_p, m)$ can be re-written as:

$$f^k(\vec{\omega}_i, \vec{\omega}_p, m) = \sum_{s=0}^{2} \left( \exp\left(m1^{(k,s)} * \max(0, \vec{h}_p \cdot n_p)^{m2^{(k,s)}}\right) - 1 \right)$$

where $f^k(\vec{\omega}_i, \vec{\omega}_p, m)$ has a contribution to the appearance of the image only when $(\vec{h}_p \cdot n_p) \geq 0$ and where · denotes the dot product.

Having all of these representation, the image formation can be re-written as follows:

$$\mathcal{J}_p^k(n_p, m, L) = \sum_{i=1}^{H_L \cdot W_L} f(\vec{\omega}_i, \vec{\omega}_p, m) L(\vec{\omega}_i) \max(0, n_p \cdot \vec{\omega}_i) d\vec{\omega}_i =$$

$$\sum_{i=1}^{H_L \cdot W_L} \left( \sum_{s=0}^{2} \left( e^{m1^{(k,s)} * \max(0, \vec{h}_p \cdot n_p)^{m2^{(k,s)}}} - 1 \right) \right) *$$

$$L^k(\vec{\omega}_i) * \max(0, n_p \cdot \vec{\omega}_i) * \sin\left(\frac{\lfloor \frac{i}{W_L} \rfloor}{H_L}\pi\right)$$

Derivative Over Light.

For lighting, the digital neural network rendering system only needs to compute the derivative over the intensity values of $L^k(\vec{\omega}_i)$, $k \in \{0, 1, 2\}$. The digital neural network rendering system does not need to compute the derivative with respect to the lighting direction since this is fixed for each pixel.

$$\frac{\partial \mathcal{J}(n, m, L)}{\partial L^k(\vec{\omega}_i)} =$$

$$\sum_{p=0}^{w \times h} \left( \sum_{s=0}^{2} \left( e^{m1^{(k,s)} * \max(0, \vec{h}_p \cdot n_p)^{m2^{(k,s)}}} - 1 \right) \right) * \max(0, n_p \cdot \vec{\omega}_i) * \sin\left(\frac{\lfloor i/W_L \rfloor}{H_L}\pi\right)$$

Derivate Over Normal.

The digital neural network rendering system computes the derivative of normal for each channel individually. For the derivative of pixel p's normal direction coordinate at each channel c, where $c \in \{0, 1, 2\}$:

$$\frac{\partial \mathcal{J}_p(n_p, m, L)}{\partial n_p^c} =$$

$$\sum_{k=0}^{2} \sum_{i=1}^{H_L \cdot W_L} \left( \sum_{s=0}^{2} \left( e^{m1^{(k,s)} * \max(0, \vec{h}_p \cdot n_p)^{m2^{(k,s)}}} - 1 \right) \right) * L^k(\vec{\omega}_i) * Y_1 *$$

$$\sin\left(\frac{\lfloor i/W_L \rfloor}{H_L}\pi\right) + \sum_{k=0}^{2} \sum_{i=1}^{H_L \cdot W_L} \left( \sum_{s=0}^{2} \left( e^{m1^{(k,s)} * \max(0, \vec{h}_p \cdot n_p)^{m2^{(k,s)}}} * Y_2 \right) \right) *$$

$$L^k(\vec{\omega}_i) * \max(0, n_p \cdot \vec{\omega}_i) * \sin\left(\frac{\lfloor i/W_L \rfloor}{H_L}\pi\right)$$

where, $$Y_1 = \begin{cases} 0, & n_p \cdot \vec{\omega}_i \leq 0 \\ \omega_i^c, & n_p \cdot \vec{\omega} > 0 \end{cases}$$

$$Y_2 = \begin{cases} 0, & \vec{h}_p \cdot n_p \leq 0 \\ m1^{(k,s)} * m2^{(k,s)} * (\vec{h}_p \cdot n_p)^{m2^{(k,s)}-1}, & \vec{h}_p \cdot n_p > 0 \end{cases}$$

and $(\omega_i^0, \omega_i^1, \omega_i^2) = \vec{\omega}_i$.

Derivative Over Material.

The digital neural network rendering system first computes the derivative with respect to the functions $m1^{(k,s)}$ and $m2^{(k,s)}$. The digital neural network rendering system also computes the derivatives of $m1^{(k,s)}$ and $m2^{(k,s)}$ with respect to the material properties m (i.e., material parameters) and applies the chain rule to obtain the derivative for the original m.

$$\frac{\partial \mathcal{J}(n_p, m, L)}{\partial m1^{(k,s)}} = \sum_{i=1}^{H_L \cdot W_L} \left( e^{m1^{(k,s)} * \max(0, \vec{h}_p \cdot n_p)^{m2^{(k,s)}}} * \max(0, \vec{h}_p \cdot n_p)^{m2^{(k,s)}} * L^k(\vec{\omega}_i) * \max(0, n_p \cdot \vec{\omega}_i) * \sin\left(\frac{\lfloor i/W_L \rfloor}{H_L} \pi\right) \right)$$

$$\frac{\partial \mathcal{J}(n_p, m, L)}{\partial m2^{(k,s)}} = \sum_{i=1}^{H_L \cdot W_L} \left( e^{m1^{(k,s)} * \max(0, \vec{h}_p \cdot n_p)^{m2^{(k,s)}}} * m1^{(k,s)} * Y * L^k(\vec{\omega}_i) \cdot \max(0, n_p \cdot \vec{\omega}_i) * \sin\left(\frac{\lfloor i/W_L \rfloor}{H_L} \pi\right) \right)$$

where, $$Y = \begin{cases} 0, & \vec{h} \cdot n_p \leq 0 \\ (\vec{h}_p \cdot n_p)^{m2^{(k,s)}} * \ln(\vec{h}_p \cdot n_p), & \vec{h}_p \cdot n_p > 0 \end{cases}$$

then applying the chain rule:

$$\frac{\partial \mathcal{J}(n_p, m, L)}{\partial m} = \left(\frac{\partial \mathcal{J}(n_p, m, L)}{\partial m1^{(k,s)}}\right) * \frac{\partial m1^{(k,s)}}{\partial m} + \left(\frac{\partial \mathcal{J}_p(n_p, m, L)}{\partial m2^{(k,s)}}\right) * \frac{\partial m2^{(k,s)}}{\partial m}$$

Training.

The digital neural network rendering system trains the proposed network architecture by defining a joint loss function that evaluates both the predictions of individual prediction facilities and images synthesized by the rendering layer. Specifically, the digital neural network rendering system defines an L2 normal loss:

$$l_{normal} = \sum_p (n_p - n'_p)^2$$

where $n_p$ and $n'_p$ denote the ground-truth and predicted surface normal for each pixel p respectively (e.g., the surface orientation loss 426). Note that since both ground-truth and predicted normal are with unit length, L2 normal loss is the same with cosine similarity loss.

Similarly, the digital neural network rendering system defines a material loss (e.g., the material property loss 424) to measure the L2 norm between the ground truth (m) and predicted material properties (m'):

$$l_{material} = (m - m')^2$$

The digital neural network rendering system also utilizes a perceptual loss, $l_{perceptual}$, to evaluate the difference between the synthesized $\{\mathcal{J}, \mathcal{O}\}$ and ground truth $\{\mathcal{J}, \mathcal{O}\}$ images (e.g., the input image loss 428 and the target input image loss 430). The digital neural network rendering system utilizes the pre-trained vgg16 network to measure $l_{perceptual}$ as described by J. Johnson, A. Alahi, and L. Fei-Fei, *Perceptual Losses for Real-Time Style Transfer and Super-Resolution*, IEEE ECCV (2016), which is incorporated by reference here in its entirety.

Finally, the digital neural network rendering system defines the overall loss, l, as a weighted combination of these individual loss functions:

$$l = w_n l_{normal} + w_m l_{material} + w_p l_{perceptual}$$

Moreover, the digital neural network rendering system empirically sets $w_n = w_m = 1$, $w_p = 0.01$.

As mentioned above, the digital neural network rendering system can generate modified digital images that portray different target properties by modifying the illumination environment, materials, and/or objects portrayed in digital images. Indeed, in one or more embodiments, the digital neural network rendering system utilizes the properties of a first digital image as a target property to modify a second digital image. In this manner, the digital neural network rendering system can create a plurality of modified digital images from one or more original digital images.

For example, FIGS. 6A-6B illustrate a plurality of modified digital images generated by a set of original digital images. In particular, FIG. 6A illustrates an array 610 of digital images generated by the digital neural network rendering system. In particular, the array 610 includes a plurality of original digital images 600a-600d. Moreover, the array 610 includes a plurality of modified digital images 602a-602c, 604a-604c, 606a-606c, 608a-608c.

The digital neural network rendering system generates the modified digital images 602a-602c, 604a-604c, 606a-606c, 608a-608c by combining different properties of the original digital images 600a-600d. For example, the digital neural network rendering system generates the modified digital image 602a by determining a material property set, an illumination environment map, and a surface orientation map for the original digital image 600a. The digital neural network rendering system also determines a material property set of the digital image 600b and replaces the material property set of the digital image 600a with the material property set of the digital image 600b. The digital neural network rendering system then utilizes a neural network with a rendering layer to generate the modified digital image 602a based on the illumination environment map and surface orientation map for the original digital image 600a and the material property set of the digital image 600b.

Similarly, the digital neural network rendering system generates the modified digital images 602b-602c by combining properties of the original digital images 600a, 600c, and 600d. Specifically, the digital neural network rendering system utilizes the material property sets of the original digital images 600c, 600d as target properties for the original digital image 600a.

By replacing properties of the original digital images 600a-600d with target properties from the other original digital images, the digital neural network rendering system generates the array 610. In particular, each column of the array reflects the same material with different objects and illumination environments form different original digital images. Moreover, each row of the array 610 reflects the same object and illumination environment with a different material from different original digital images.

Similarly, FIG. 6B illustrates an array 620 of digital images generated by the digital neural network rendering system. In particular, the array 620 includes a plurality of original digital images 622a-622d. Moreover, the array 620 includes a plurality of modified digital images 624a-624c, 626a-626c, 628a-628c, 630a-630c.

The digital neural network rendering system generates the modified digital images 624a-624c, 626a-626c, 628a-628c, 630a-630c by combining different properties of the original digital images 622a-622d. For example, the digital neural network rendering system generates the modified digital image 626a by determining a surface orientation map, a material property set, and an illumination environment map for the original digital image 622a. The digital neural network rendering system replaces the surface orientation map of the original digital image 622a with a surface orientation map of the digital image 622b. Moreover, the digital neural network rendering system utilizes a neural network with a rendering layer to generate the modified digital image 626a based on the surface orientation map of the digital image 622b and the material property set and illumination environment map of the original digital image 622a. Thus, the modified digital image 626a portrays an object from the original digital image 622b with the material and illumination environment of the original digital image 622a.

Similarly, the digital neural network rendering system generates the modified digital images 628a, 630a by combining properties of the original digital images 622a, 622c, and 622d. Specifically, the digital neural network rendering system utilizes the surface orientation maps of the original digital images 622c, 622d as target properties for the original digital image 622a.

By replacing properties of the original digital images 622a-622d with target properties from other original digital images, the digital neural network rendering system generates the array 620. In particular, each column of the array reflects the same material and illumination environment with different objects form different original digital images. Moreover, each row of the array 620 reflects the same object with a different material and illumination environment from different original digital images.

Notably, the digital neural network rendering system can operate in conjunction with both diffuse and specular materials. Indeed, as shown in the arrays 610, 620, the digital neural network rendering system can change diffuse materials portrayed in a digital image with more specular materials (and vice versa). Moreover, the digital neural network rendering system can modify objects and illumination environments in relation to digital images portraying diffuse and/or specular materials.

The digital neural network rendering system can also provide the arrays 610, 620 for display to one or more users. For example, the digital neural network rendering system can provide the arrays 610, 620 for display and receive user input in relation to one or more digital images of the arrays 610, 620. Based on user interaction with one or more images, the digital neural network rendering system can apply a target property to an original digital image and generate a modified digital image.

Figure 7:
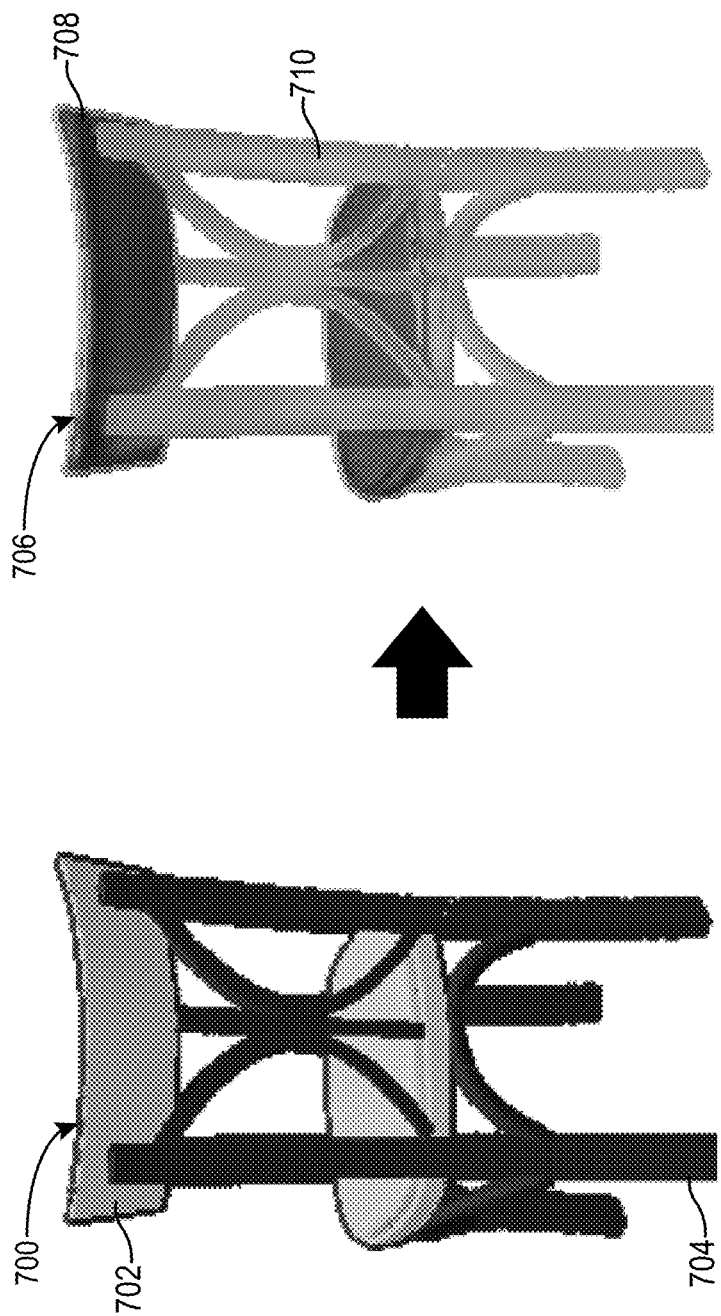
FIG. 7 illustrates generating a modified digital image portraying two modified materials utilizing two target material property sets in accordance with one or more embodiments.

Although FIGS. 6A-6B illustrate generating modified digital images by changing a single material portrayed in the digital image, in one or more embodiments, the digital neural network rendering system modifies a plurality of materials portrayed in a digital image. For example, FIG. 7 illustrates modifying a digital image portraying a first material and a second material. Specifically, FIG. 7 illustrates an object 700 portrayed in a digital image. The object 700, as portrayed, includes a first material 702 and a second material 704. As shown, the digital neural network rendering system can modify the first material 702 and the second material 704 to generate a modified object 706 in a modified digital image. In particular, the modified object 706 reflects a third material 708 and a fourth material 710. The digital neural network rendering system generates the modified object 706 by replacing a material property set corresponding to the first material 702 with a material property set corresponding to the third material 708 and replacing a material property set corresponding to the second material 704 with a material property set corresponding to the fourth material 710.

Specifically, the digital neural network rendering system determines areas of the object 700 that are composed of different materials. The digital neural network rendering system can utilize a variety of classifiers or material detection algorithms to determine segmentation masks denoting regions of uniform material. The digital neural network rendering system then predicts (e.g., utilizing the material property prediction facility 208) a first material property set (corresponding to the first material 702) and a second material property set (corresponding to the second material 704) for each region/material. The digital neural network rendering system can also predict a surface orientation map and illumination environment map for the entire digital image. The digital neural network rendering system replaces the first material property set (corresponding to the first material 702) and the second material property set (corresponding to the second material 704) with a third material property set (corresponding to the third material 708) and fourth material property set (corresponding to the fourth material 710). The digital neural network rendering system provides the surface orientation map, the illumination environment map, the third material property set, and the fourth material property set to a rendering layer to generate the modified digital image portraying the modified object 706.

As mentioned above, the digital neural network rendering system can improve the accuracy of generating modified digital images. Indeed, experimenters have conducted empirical research to determine improvement over existing approaches and the benefits associated with incorporating a rendering layer in a neural network as described above. For instance, experimenters trained a single network with a large amount of synthetic data generated for car, chair, sofa, and monitor categories. Experimenters utilized a total of 280 3D models (130 cars, 50 chairs, 50 sofas and 50 monitors) obtained from ShapeNet. Experimenters used BRDF measurements corresponding to 80 different materials provided in the MERL database. Moreover, experimenters utilized 14 HDR environment maps to represent illumination.

For each 3D model, material, and illumination combination experimenters rendered 5 random views from a fixed set of pre-sampled 24 viewpoints around the object with fixed elevation. Experimenters split the data such that no shape and material was shared between training and test sets. Specifically, experimenters used 80 cars for pretraining, and 40 shapes per each category for joint category fine-tuning, leaving 10 shapes per category for testing. Out of the 80 materials, experimenters left 20 for testing and used the rest in pre-training and training. This split resulted in generating 336K pre-training instances, and 672K multi-category fine tuning instances. In total, experimenters trained the network with over one million unique material-shape-illumination configurations.

Experimenters initialized the weights from a uniform distribution: [−0.08, 0.08] and utilized Adam optimizer using stochastic gradient descent, as described in D. Kingma and J. Ba. Adam: *A Method for Stochastic Optimization*, arXiv preprint arXiv: 1412.6980 (2014), which is incorporated herein by reference in its entirety. Kingma and Adam propose momentum parameters $\beta_1=0.9$ and $\beta_2=0.999$, and a learning rate of 0.001. Experimenters found that conventional rates were too high and used a rate of $1 \times 10^{-6}$ for pretraining and $1 \times 10^{-8}$ for training. Experimenters also reduced the first momentum parameters $\beta_1$ to 0.5 resulting in more stable training. Once the network was converged, experimenters fine-tuned the normal prediction facility by setting $w_n=1.0$, $w_p=0.0001$.

To test the network, experimenters randomly selected an image corresponding to a shape, environment map, and material as input. Experimenters then provided the image and a target material set to a neural network of the form illustrated in FIG. 2. The neural network generated a modified digital image reflecting the target material property set. Experimenters compared this output to ground truth using L2 metric (measuring pixel-wise error) and SSIM metric (measuring structural difference). Note that lower number are better for the L2 metric and higher number are better for the SSIM metric. The experimental results are summarized in Table 1.

TABLE 1

|      | Car Category | Chair Category | Sofa Category | Monitor Category |
|------|--------------|----------------|---------------|------------------|
| L2   | 475.5        | 570.6          | 245.4         | 530.9            |
| SSIM | 0.9442       | 0.9258         | 0.9695        | 0.9293           |

Experimenters also conducted additional evaluation of two different neural networks: one trained with a perceptual loss utilizing a rendering layer (as described above, for example, in relation to FIG. 4) and another standalone network trained without such a perceptual loss but based on L2 loss of a material property set. The results, as illustrated in Table 2, demonstrate that a loss measure based on material properties is not sufficient in capturing the physical material properties, as a small L2 error may result in large visual discrepancies in the rendering output. Incorporation of the rendering layer (and perceptual losses), on the other hand resolves this problem by treating the material coefficients in accordance with their true physical meaning.

TABLE 2

|                      | L2     | SSIM   |
|----------------------|--------|--------|
| Standalone (Material) | 2285.2 | 0.9626 |
| With Perceptual Loss  | 286.9  | 0.9895 |

In addition, experimenters also conducted evaluation of two different neural networks: one trained with a perceptual loss utilizing a rendering layer and another trained without such a perceptual loss (but based on L2 loss of a surface orientation map). The results, as provided in Table 3, demonstrate that a loss measure based on surface orientation results in small errors, but produces blurry output. Adding perceptual loss helps to preserve sharp features resulting in visually more plausible results.

TABLE 3

|                         | L2    | SSIM   |
|-------------------------|-------|--------|
| Standalone (Orientation) | 313.2 | 0.9441 |
| With Perceptual Loss     | 238.5 | 0.9625 |

Experimenters also compared the experimental embodiment of the digital neural network rendering system described above with the approach described in S. Lombardi and K. Nishino. Reflectance and Natural Illumination From a Single Image, IEEE ECCV, 582-595 (2012). This Lombardi approach uses certain priors to optimize for illumination and material properties in a single image of an object with known geometry. The Lombardi approach makes prior assumptions and the PCA-based material representation propagates approximation errors to the light estimation. Table 4 illustrates the results, which show that the digital neural network rendering system significantly improves resulting accuracy.

TABLE 4

|      | Lombardi | Digital Neural Network Rendering System |
|------|----------|------------------------------------------|
| L2   | 4417.1   | 455.6                                    |
| SSIM | 0.8796   | 0.9422                                   |

In sum, the digital neural network rendering system can outperform conventional systems by inferring priors from the data itself, explicitly modeling the rendering process, and utilizing a more accurate material representation.

Figure 8:
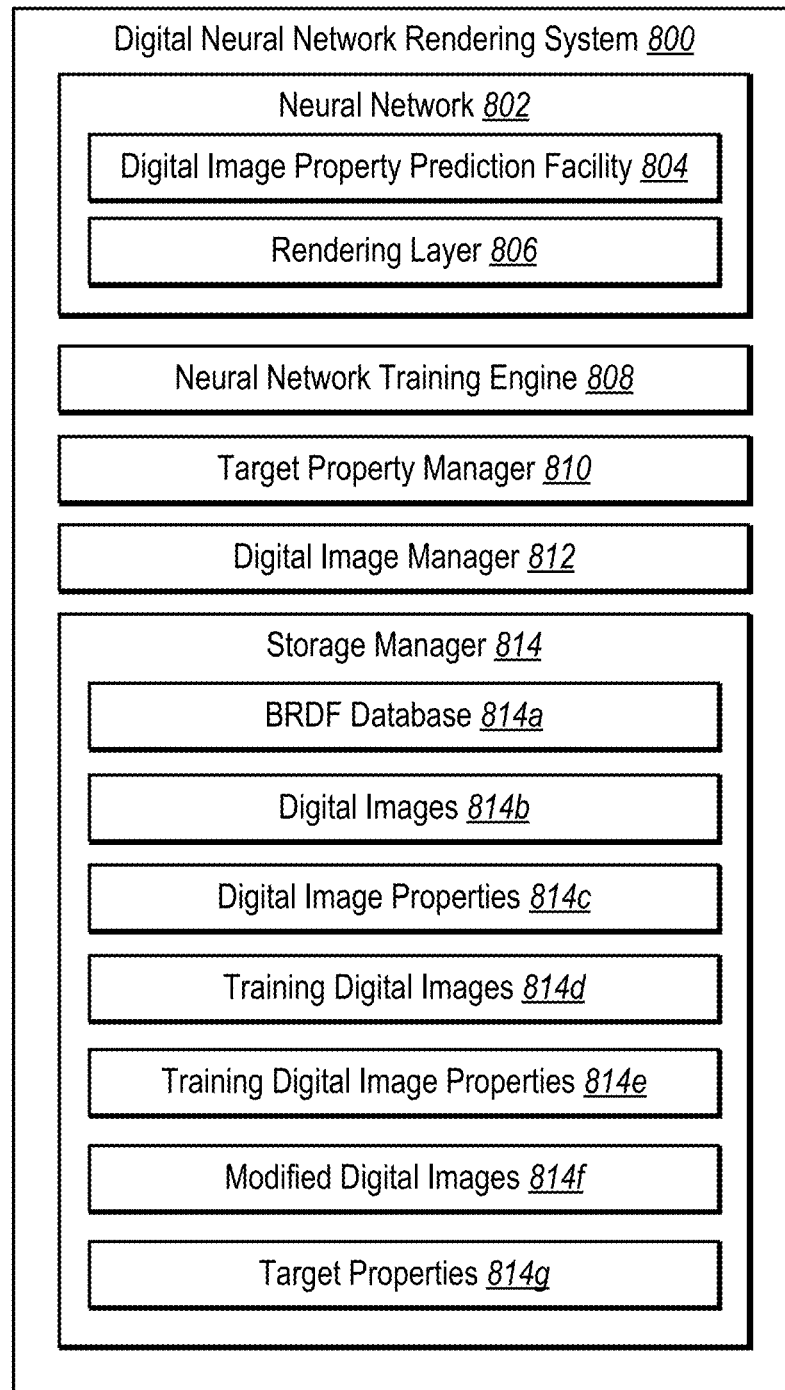
FIG. 8 illustrates a schematic diagram illustrating a digital neural network rendering system in accordance with one or more embodiments.

Turning now to FIG. 8, additional detail is provided regarding components and capabilities of one embodiment of the digital neural network rendering system. In particular, FIG. 8 illustrates an embodiment of an exemplary digital neural network rendering system 800 (e.g., the digital neural network rendering system referenced above). As shown, the digital neural network rendering system 800 may include, but is not limited to a neural network 802 comprising a digital image property prediction facility 804 and a rendering layer 806; a neural network training engine 808; a target property manager 810; a digital image manager 812; and a storage manager 814 (comprising a BRDF database 814a, digital images 814b, digital image properties 814c, training digital images 814d, training digital image properties 814e, modified digital images 814f, and target properties 814g).

As just mentioned, and as illustrated in FIG. 8, the digital neural network rendering system 800 may include the neural network 802. As described above, the neural network 802 can receive one or more input images and generate a modified digital image. Moreover, as shown, in FIG. 8, the neural network can include the digital image property prediction facility 804 and the rendering layer 806.

The digital image property prediction facility 804 can determine, identify, decompose and/or predict one or more properties of a digital image. For example, the digital image property prediction facility 804 can predict a material (i.e., a material property set), an object (i.e., a surface orientation map), and/or an illumination (i.e., an illumination environment map) portrayed in a digital image. Accordingly, the digital image property prediction facility 804 can include the material property prediction facility 208, the surface orientation prediction facility 28, and/or the illumination environment prediction facility 212, described above.

As described above, the digital image property prediction facility 804 can utilize advanced material properties, such as bidirectional reflectance distribution functions. Moreover, digital image property prediction facility generates a parametric function based on bidirectional reflectance distribution functions (e.g., the BRDF database 814a) that is differentiable with regard to incoming and outgoing light directions (and material properties). The digital image property prediction facility 804 can utilize these parametric functions to predict material property sets.

The digital image property prediction facility 804 can also utilize an illumination environment map that comprises a spherical panorama digital image. In particular, the digital image property prediction facility can generate an illumination environment map that comprises a two-dimensional spherical panorama digital image, where the position of each pixel in the two-dimensional spherical panorama digital image corresponds to an incoming direction of a light ray and the value of each pixel reflects the intensity of the corresponding light ray.

Moreover, as shown in FIG. 8, the neural network 802 can also include the rendering layer 806. The rendering layer 806 can generate, synthesize, or create a digital image. In particular, the rendering layer 806 can generate a digital image based on intrinsic properties (e.g., a material property set, a surface orientation map, and an illumination environment map generated by the digital image property prediction facility 804). Moreover, the rendering layer can generate a modified digital image utilizing a target property.

As discussed above, the rendering layer 806 can generate a modified digital image utilizing advanced material properties. For example, the rendering layer 806 can utilize a differentiable parametric function based on a bidirectional reflectance distribution functions database (i.e., the BRDF database 814*a*) to render a modified digital image. Moreover, the rendering layer 806 can utilize an illumination environment map in the form of a spherical panorama digital image to generate a modified digital image (e.g., the digital image properties 814*c*).

As shown in FIG. 8, the digital neural network rendering system 800 also includes the neural network training engine 808. The neural network training engine 808 can teach, train, guide, or inform a neural network (e.g., the neural network 802) to generate a modified digital image. In particular, the neural network training engine 808 can train a neural network by providing a training input image to the neural network and determining a measure of loss in relation to output of the neural network. For example, the neural network training engine can determine a measure of loss by comparing a predicted property from the neural network 802 (e.g., a predicted material property set, a predicted surface orientation map, and/or an illumination environment map) with known training properties corresponding to the training input image (e.g., a training material property set, a training surface orientation map, and/or a training illumination environment map).

The neural network training engine 808 can also determine a measure of loss from one or more synthesized digital images generated by the neural network 802. For example, the neural network training engine 808 can compare a synthesized training image generated by the neural network 802 with a training input image. Similarly, the neural network training engine 808 can compare a training target image with a synthesized target image generated utilizing a training target property corresponding to the training target image.

As illustrated in FIG. 8, the digital neural network rendering system 800 also includes the target property manager 810. The target property manager 810 can identify, select, provide, and/or manage one or more target properties. For example, the target property manager 810 can provide a visual indication (e.g., user interface elements) corresponding to one or more target properties. Moreover, the target property manager 810 can receive user input (e.g., a selection) in relation to the visual indication. Based on the user input, the target property manager 810 can identify a target property to apply to an input digital image in generating a modified digital image.

For example, the target property manager 810 can receive a request to change an illumination environment to a second illumination environment (and the neural network 802 can generate a modified object that reflects the second illumination environment). Similarly, the target property manager 810 can receive a request to change a material to a second material (and the neural network 802 can generate a modified digital image that portrays a modified object that reflects the second material).

Moreover, as shown in FIG. 8, the digital neural network rendering system 80 also includes the digital image manager 812. The digital image manager 812 can provide, select, and/or manage digital images. For example, the digital image manager 812 can receive user input and select one or more input digital images to provide the neural network 802. Similarly, the digital image manager 812 can provide one or more modified digital images for display to a user. Indeed, in one or more embodiments, the digital image manager 812 can generate an array comprising a plurality of input digital images and modified digital images (e.g., as shown in relation to FIGS. 6A-6B).

Moreover, as illustrated in FIG. 8, the digital neural network rendering system 800 also includes the storage manager 814. The storage manager 814 maintains data to perform the functions of the digital neural network rendering system 800. As illustrated, the storage manager 814 includes BRDF database 814*a* (i.e., a database of bidirectional reflectance distribution functions and corresponding material properties), digital images 814*b* (e.g., a repository of digital images that can be utilized as input digital images), digital image properties 814*c* (e.g., properties determined by the neural network 802 for input digital images such as surface orientation maps, illumination environment maps, and/or material property sets), training digital images 814*d* (e.g., training input images and/or training target images), training digital image properties 814*e* (e.g., ground truth training properties, such as training surface orientation maps, training illumination environment maps, training material property sets, and/or training target properties), modified digital images 814*f*, and target properties 814*g*.

Moreover, in one or more embodiments, the storage manager 814 can also include the neural network 802. For example, upon training the neural network 802, the digital neural network rendering system 800 can store the neural network via the storage manager 814 (e.g., via a server and/or a client device) for utilization in generating modified digital images (e.g., at the server and/or at the client device as described in greater detail in relation to FIG. 9).

Each of the components 802-814 of the digital neural network rendering system 800 (as shown in FIG. 8) may be in communication with one another using any suitable communication technologies. It will be recognized that although components 802-814 of the digital neural network rendering system 800 are shown to be separate in FIG. 8, any of components 802-814 may be combined into fewer components, such as into a single facility or module, divided into more components, or configured into different components as may serve a particular embodiment.

The components 802-814 of the digital neural network rendering system 800 can comprise software, hardware, or both. For example, the components 802-814 can comprise one or more instructions stored on a computer-readable storage medium and executable by processors of one or more computing devices. When executed by the one or more processors, the computer-executable instructions of the digital neural network rendering system 800 can cause a client device and/or a server device to perform the methods described herein. Alternatively, the components 802-814 and their corresponding elements can comprise hardware, such as a special purpose processing device to perform a certain function or group of functions. Additionally, the components 802-814 can comprise a combination of computer-executable instructions and hardware.

Furthermore, the components 802-814 may, for example, be implemented as one or more operating systems, as one or more stand-alone applications, as one or more modules of an application, as one or more plug-ins, as one or more library functions or functions that may be called by other applications, and/or as a cloud-computing model. Thus, the components 802-814 may be implemented as a stand-alone application, such as a desktop or mobile application. Furthermore, the components 802-814 may be implemented as one or more web-based applications hosted on a remote server. The components 802-814 may also be implemented in a suit of mobile device applications or "apps." To illustrate, the components 802-814 may be implemented in an application, including but not limited to ADOBE® PHOTOSHOP® software or ADOBE® ILLUSTRATOR® software. "ADOBE," "PHOTOSHOP," and "ILLUSTRATOR," are either registered trademarks or trademarks of Adobe Systems Incorporated in the United States and/or other countries.

Figure 9:
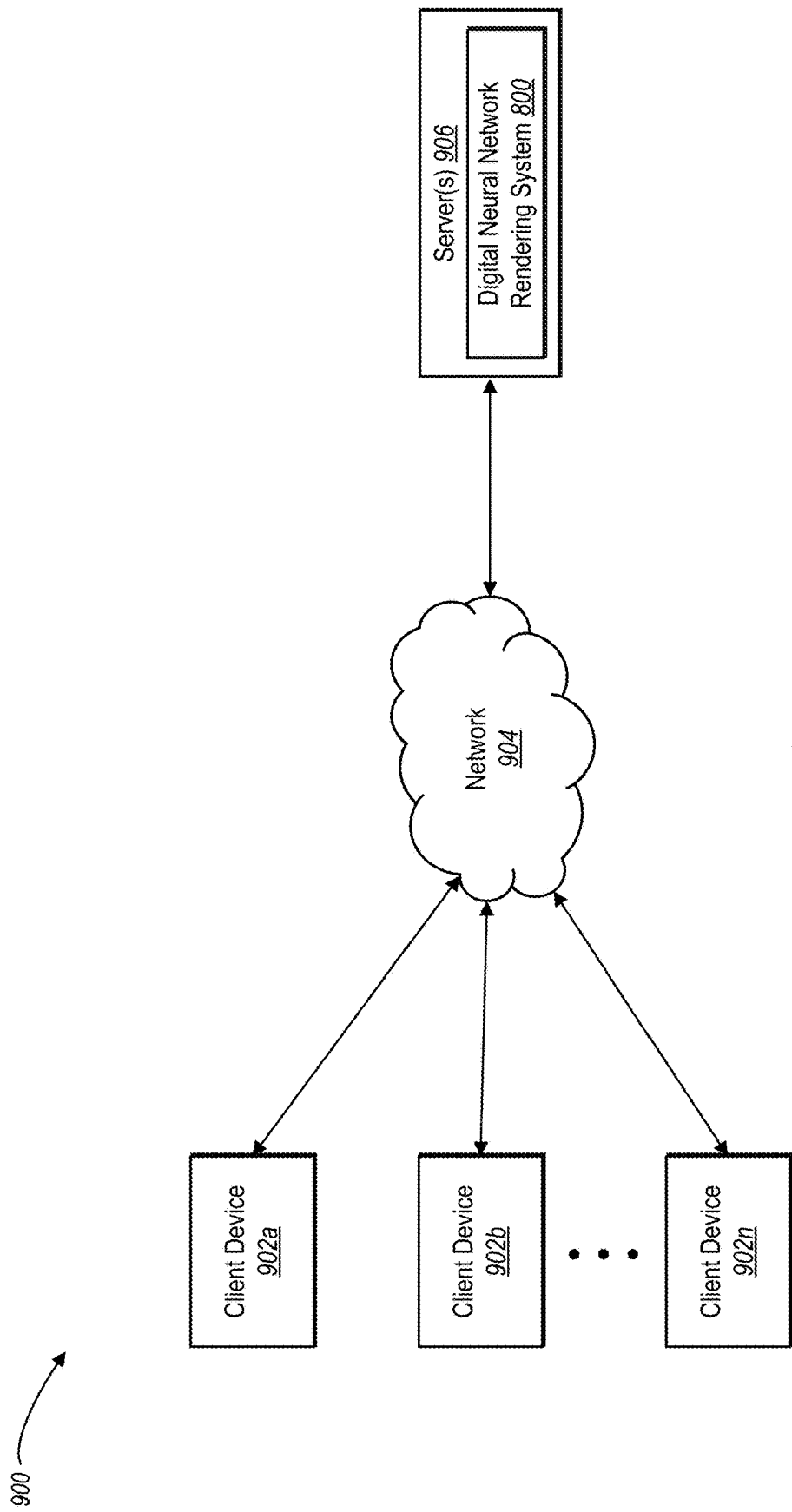
FIG. 9 illustrates a schematic diagram illustrating an exemplary environment in which the digital neural network rendering system may be implemented in accordance with one or more embodiments.

FIG. 9 illustrates a schematic diagram of one embodiment of an exemplary environment 900 in which the digital neural network rendering system 800 can operate. In one or more embodiments, the exemplary environment 900 includes one or more client devices 902a, 902b, . . . 902n, a network 904, and server(s) 906. The network 904 may be any suitable network over which the computing devices can communicate. Example networks are discussed in more detail below with regard to FIG. 13.

As illustrated in FIG. 9, the environment 900 may include client devices 902a-902n. The client devices 902a-902n may comprise any computing device. For instance, in one or more embodiments, one or more of the client devices 902a-902n comprise one or more computing devices described below in relation to FIG. 13.

In addition, the environment 900 may also include the server(s) 906. The server(s) 906 may generate, store, receive, and transmit any type of data, including BRDF database 814a, digital images 814b, digital image properties 814c, training digital images 814d, training digital image properties 814e, modified digital images 814f, and target properties 814g. For example, the server(s) 906 may transmit data to a client device, such as the client device 902a. The server(s) 906 can also transmit electronic messages between one or more users of the environment 900. In one example embodiment, the server(s) 906 comprise a content server. The server(s) 906 can also comprise a communication server or a web-hosting server. Additional details regarding the server(s) 906 will be discussed below with respect to FIG. 13.

As illustrated, in one or more embodiments, the server(s) 906 can include all, or a portion of, the digital neural network rendering system 800. In particular, the digital neural network rendering system 800 can comprise an application running on the server(s) 906 or a portion of a software application that can be downloaded from the server(s) 906. For example, the digital neural network rendering system 800 can include a web hosting application that allows the client devices 902a-902n to interact with content hosted at the server(s) 906. To illustrate, in one or more embodiments of the exemplary environment 900, one or more client devices 902a-902n can access a webpage supported by the server(s) 906. In particular, the client device 902a can run an application to allow a user to access, view, and/or interact with a webpage or website hosted at the server(s) 906.

Although FIG. 9 illustrates a particular arrangement of the client devices 902a-902n, the network 904, and the server(s) 906, various additional arrangements are possible. For example, while FIG. 9 illustrates multiple separate client devices 902a-902n communicating with the server(s) 906 via the network 904, in one or more embodiments a single client device may communicate directly with the server(s) 906, bypassing the network 904.

Similarly, although the environment 900 of FIG. 9 is depicted as having various components, the environment 900 may have additional or alternative components. For example, the digital neural network rendering system 800 can be implemented on a single computing device. In particular, the digital neural network rendering system 800 may be implemented in whole by the client device 902a or the digital neural network rendering system 800 may be implemented in whole by the server(s) 906. Alternatively, the digital neural network rendering system 800 may be implemented across multiple devices or components (e.g., utilizing the client devices 902a-902n and the server(s) 906).

By way of example, in one or more embodiments, the client device 902a sends a request to the server(s) 906 to edit one or more digital images. The server(s) 906 can provide for display indications of a plurality of digital images and target properties (e.g., via the target property manager 810 and the digital image manager 812) to the client device 902a. The client device 902a can receive user selection of a digital image and a target property (e.g., via the target property manager 810 and the digital image manager 812) and provide an indication of the selected digital image and target property to the server(s) 906. The server(s) 906 can provide the selected digital image as an input digital image to a neural network with a rendering layer (e.g. the neural network 802). The neural network can decompose the input digital image into intrinsic properties and replace one of the intrinsic properties with the selected target property (e.g., via the digital image property prediction facility 804). The rendering layer of the neural network (e.g., the rendering layer 806) can utilize the remaining intrinsic properties and the target property to generate a modified digital image (i.e., a modified digital image that reflects the input digital image with the target property). Moreover, the server(s) 906 can provide the modified digital image to the client device 902a for display.

Figure 10:
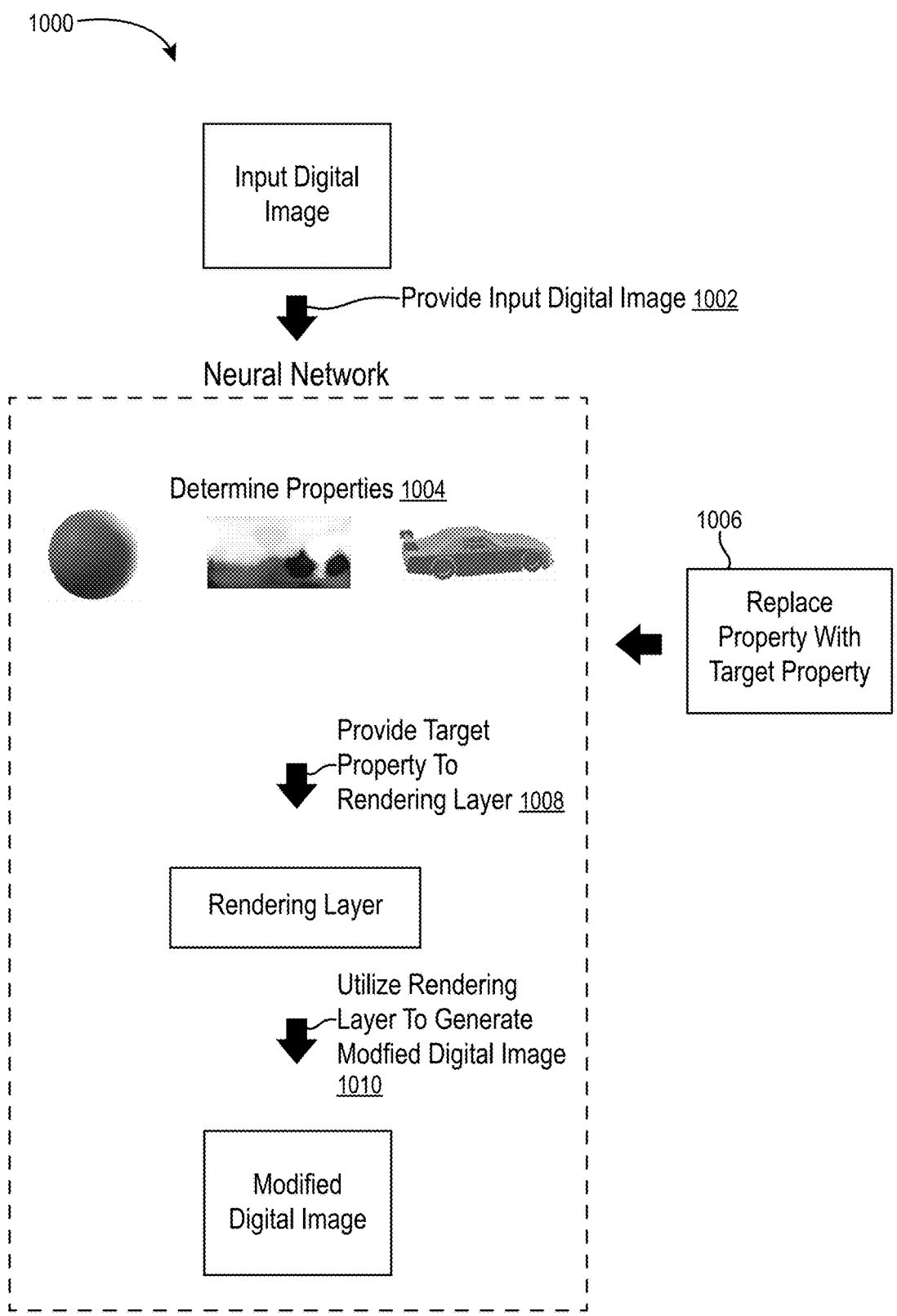
FIG. 10 illustrates a representation of acts in a step for rendering a modified digital image reflecting an input digital image with a modified property utilizing a neural network with a rendering layer trained to generate target digital images portraying diffuse and specular materials, in accordance with one or more embodiments.

Turning now to FIG. 10 additional detail will be provided regarding rendering a modified digital image. In particular, FIG. 10 illustrates a series of acts 1002-1010 in a step 1000 for rendering a modified digital image (i.e., a step for rendering a modified digital image reflecting the input digital image with the modified property utilizing a neural network with a rendering layer trained to generate target digital images portraying diffuse and specular materials).

As illustrated in FIG. 10, the step 1000 includes an act 1002 of providing an input digital image. In particular, the act 1002 includes providing an input digital image to a neural network. Indeed, as described above (for example in relation to FIG. 2 and FIG. 4), the digital neural network rendering system can provide an input image to a neural network trained to generate modified digital images.

Moreover, as shown in FIG. 10, the step 1000 also includes the act 1004 of determining properties. In particular, the act 1004 can include determining properties utilizing a property prediction facility (as described above). For example, the act 1004 can include generating a material property set corresponding to the input digital image, generating an illumination environment map, and/or generating a surface orientation map (as further described above, for example, in relation to FIGS. 2-3).

In addition, as illustrated in FIG. 10, the step 1000 also includes the act 1006 of replacing a property with a target property. In particular, the act 1006 can include replacing the generated material property set, the generated illumination environment map, and/or the generated surface orientation map with a corresponding target property (as described above, for example, in relation to FIG. 2). For example, the act 1006 can include replacing a generated material property set with a target material property set.

As illustrated in FIG. 10, the step 1000 also includes the act 1008 of providing the target property to a rendering layer. In particular, the act 1008 includes providing the target property and remaining (i.e., unreplaced) properties to a rendering layer of the neural network (as described, for example, in relation to FIG. 2). For instance, the act 1008 can include providing the target material property set with the generated illumination environment map and the generated surface orientation map.

Furthermore, as shown in FIG. 10, the step 1000 also includes the act 1010 of utilizing the rendering layer to generate a modified digital image. For example, as described above, the act 1010 can include utilizing the trained rendering layer to synthesize a modified digital image based on the target property and remaining (i.e., unreplaced) properties (e.g., as described in greater detail above). Moreover, the act 1010 can include utilizing the rendering layer to generate a modified digital image that reflects the target property and the remaining (i.e., unreplaced) properties.

In one or more embodiments, the digital neural network rendering system receives an input digital image portraying an object within an illumination environment, wherein the object comprises a surface of a material, and wherein the surface has a surface normal direction. Furthermore, the digital neural network rendering system receives a request to modify an intrinsic property of the input digital image, wherein the intrinsic property comprises at least one of the material, the surface normal direction, or the illumination environment. In response to receiving a request to modify the intrinsic property, the digital neural network rendering system can perform the step 1000 for rendering a modified digital image reflecting the input digital image with the modified property utilizing a neural network with a rendering layer trained to generate target digital images portraying diffuse and specular materials.

In one or more embodiments, the request to modify the property comprises a request to change the illumination environment to a second illumination environment and the modified digital image portrays a modified object that reflects the second illumination environment. Moreover, in one or more embodiments, the request to modify the property comprises a request to change the material to a second material and wherein the modified digital image portrays a modified object that reflects the second material. Similarly, the request to modify the property can comprise a request to change the surface normal direction by replacing the object with a second object that comprises a second surface of a second material having a second normal direction and the modified digital image can portray the second normal direction of the second object with the material of the object in the illumination environment of the input digital image.

In addition, in one or more embodiments, receiving the request to modify the property comprises receiving user input of a second digital image comprising the modified property. Further, in one or more embodiments, the modified digital image portrays a specular material. Similarly, in one or more embodiments, the input digital image portrays a specular material.

Figure 11:
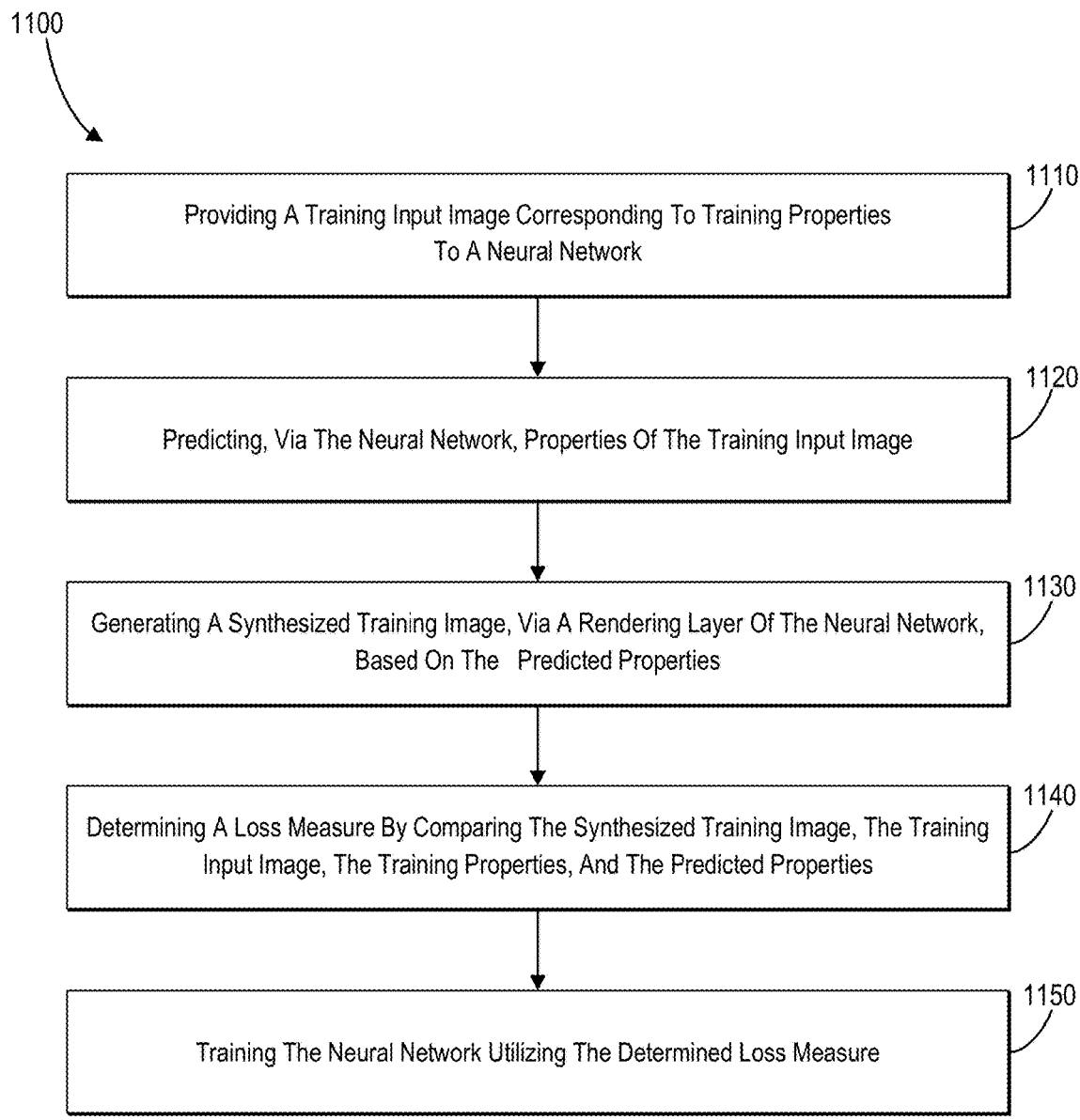
FIG. 11 illustrates a flowchart of a series of acts in a method of training a neural network with a rendering layer to generate modified digital images in accordance with one or more embodiments.
Figure 12:
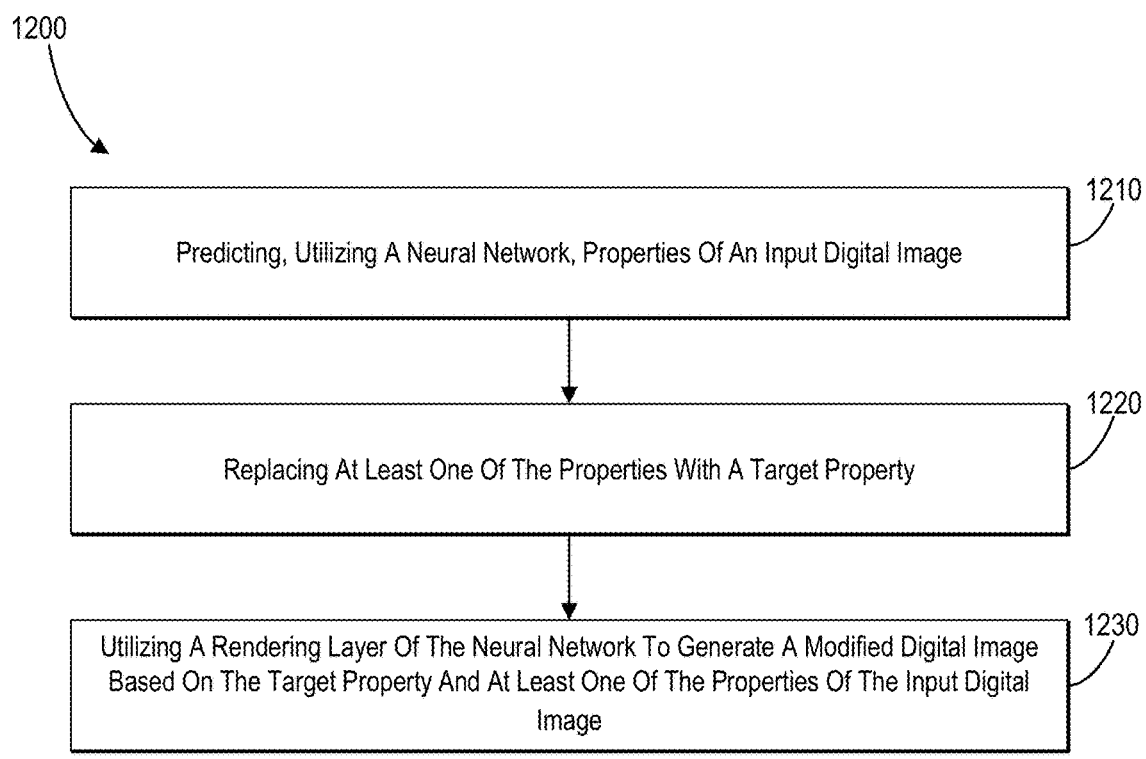
FIG. 12 illustrates another flowchart of a series of acts in a method of generating modified digital images utilizing a neural network with a rendering layer in accordance with one or more embodiments.

FIGS. 1-10, the corresponding text, and the examples, provide a number of different systems and devices for rendering digital images of a virtual environment utilizing full path space learning. In addition to the foregoing, embodiments can also be described in terms of flowcharts comprising acts and steps in a method for accomplishing a particular result. For example, FIGS. 11-12 illustrates flowcharts of exemplary methods in accordance with one or more embodiments. The methods described in relation to FIGS. 11-12 may be performed with less or more steps/acts or the steps/acts may be performed in differing orders. Additionally, the steps/acts described herein may be repeated or performed in parallel with one another or in parallel with different instances of the same or similar steps/acts.

FIG. 11 illustrates a flowchart of a series of acts in a method 1100 of generating modified digital images utilizing a neural network with a rendering layer in accordance with one or more embodiments. In one or more embodiments, the method 1100 is performed in a digital medium environment that includes the digital neural network rendering system 800. The method 1100 is intended to be illustrative of one or more methods in accordance with the present disclosure, and is not intended to limit potential embodiments. Alternative embodiments can include additional, fewer, or different steps than those articulated in FIGS. 11-12.

As illustrated in FIG. 11, the method 1100 includes an act 1110 of providing a training input image corresponding to training properties to a neural network. In particular, the act 1110 can include providing a training input image to a neural network, wherein the training input image corresponds to a training material property set, a training surface orientation map, and a training illumination environment map. In one or more embodiments, the illumination environment map comprises a spherical panorama digital image comprising a plurality of pixels, wherein the position of each pixel in the plurality of pixels of the spherical panorama digital image reflects an incoming light direction corresponding to light rays portrayed in the input digital image.

In addition, as shown in FIG. 11, the method 1100 also includes an act 1120 of predicting, via the neural network, properties of the training input image. In particular, the act 1120 can include predicting, via the neural network, a material property set, a surface orientation map, and an illumination environment map based on the training input image. For example, in one or more embodiments, the act 1120 includes utilizing a parametric representation that is differentiable with respect incoming light directions, outgoing light directions, and material properties (i.e., material coefficients or material parameters). In particular, in one or more embodiments, the parametric representation comprises a linear combination of a bidirectional reflectance distribution function database comprising bidirectional reflectance distribution functions corresponding to a plurality of materials Moreover, as illustrated in FIG. 11, the method 1100 also includes an act 1130 of generating a synthesized training image, via a rendering layer of the neural network, based on the predicted properties. In particular, the act 1130 can include generating a synthesized training image, via a rendering layer of the neural network, based on the material property set, the surface orientation map, and the illumination environment map.

As shown in FIG. 11, the method 1100 also includes an act 1140 of determining a loss measure by comparing the synthesized training image, the training input image, the training properties, and the predicted properties. In particular, the act 1140 can include determining a loss measure by comparing the synthesized training image, the training input image, the training material property set, the predicted material property set, the training surface orientation map, and the predicted surface orientation map. In addition, the method 1100 can also include accessing a training target image and training target property. Specifically, the training target image can comprise the training input image modified to portray the training target property. The method 1100 can also include providing the training target property to the neural network; and generating a synthesized target image, via the rendering layer of the neural network, based on the training target property and at least two of the following: the predicted material property set, the predicted surface orientation map, and the predicted illumination environment map. Furthermore, the act 1140 can include comparing the training target image and the synthesized target image. For instance, the training target property can include at least one of a target material property set different than the training material property set, a target training surface orientation map different than the surface orientation map, or a target illumination environment map different from the training illumination environment map.

Further, as illustrated in FIG. 11, the method 1100 also includes an act 1150 of training the neural network utilizing the determined loss measure. In particular, the act 1150 can include training the neural network utilizing the determined loss measure to generate a modified digital image from an input digital image. For example, the act 1150 can include back-propagating the loss measure to the neural network to train the neural network to generate a modified digital image from an input digital image.

FIG. 12 illustrates a flowchart of a series of acts in a method 1200 of generating modified digital images utilizing a neural network with a rendering layer in accordance with one or more embodiments. As shown, the method 1200 includes an act 1210 of predicting, utilizing a neural network, properties of an input digital image. In particular, the act 1210 can include predicting, utilizing the neural network, at least two of a material property set, a surface orientation map, or an illumination environment map based on the input digital image. Moreover, in one or more embodiments, the neural network comprises a rendering layer trained to generate synthesized digital images from input digital images portraying diffuse materials and input digital images portraying specular materials. For example, in one or more embodiments, the act 1210 includes predicting the surface orientation map, the illumination environment map, and the material property set based on the input digital image.

In addition, as illustrated in FIG. 12, the method 1200 also includes and act 1220 of replacing at least one of the properties with a target property. In particular, the act 1220 can include replacing at least one of the material property set, the surface orientation map, or the illumination environment map with a target material property set, a target surface orientation map, or a target illumination map. For example, in one or more embodiments the act 1220 includes replacing the material property set with the target material property set. Moreover, the act 1220 can also include predicting, utilizing the neural network, the material property set based on a parametric representation that is differentiable with respect to incoming light directions, outgoing light directions, and material properties (i.e., material coefficients or material parameters). Similarly, the act 1220 can include predicting, utilizing the neural network, the material surface orientation map, wherein the surface orientation map comprises an RGB digital image having a plurality of pixels with RBG, where the RBG value of each pixel of the plurality of pixel encodes the x, y, and z dimensions of the surface orientation of each pixel of the object portrayed in the digital image.

Moreover, as shown in FIG. 12, the method also includes an act 1230 of utilizing a rendering layer of the neural network to generate a modified digital image based on the target property and at least one of the properties of the input digital image. In particular, the act 1230 can include utilizing the rendering layer of the neural network to generate a modified digital image from the input image based on at least one of the target material property set, the target surface orientation map, or the target illumination map. For example, the act 1230 can include utilize the rendering layer of the neural network to generate the modified digital property based on the target material property, the surface orientation map, and the illumination environment map. Moreover, in one or more embodiments, the act 1230 includes generating the modified digital image such that the modified digital image portrays a specular material.

Moreover, in one or more embodiments of the method 1200, the input digital image portrays a first material corresponding to the material property set and portrays a second material. The method 1200 can further include predicting, utilizing the neural network, the material property set corresponding to the first material and a second material property set corresponding to the second material; replacing the material property set with the target material property set; replacing the second material property set with a second target material property set; and utilizing the rendering layer of the neural network to generate the modified digital image based on the target material property set, the second target material property set, the target surface orientation map, and the target illumination map.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., a memory, etc.), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. In some embodiments, computer-executable instructions are executed on a general-purpose computer to turn the general-purpose computer into a special purpose computer implementing elements of the disclosure. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. In this description, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In this description and in the claims, a "cloud-computing environment" is an environment in which cloud computing is employed.

Figure 13:
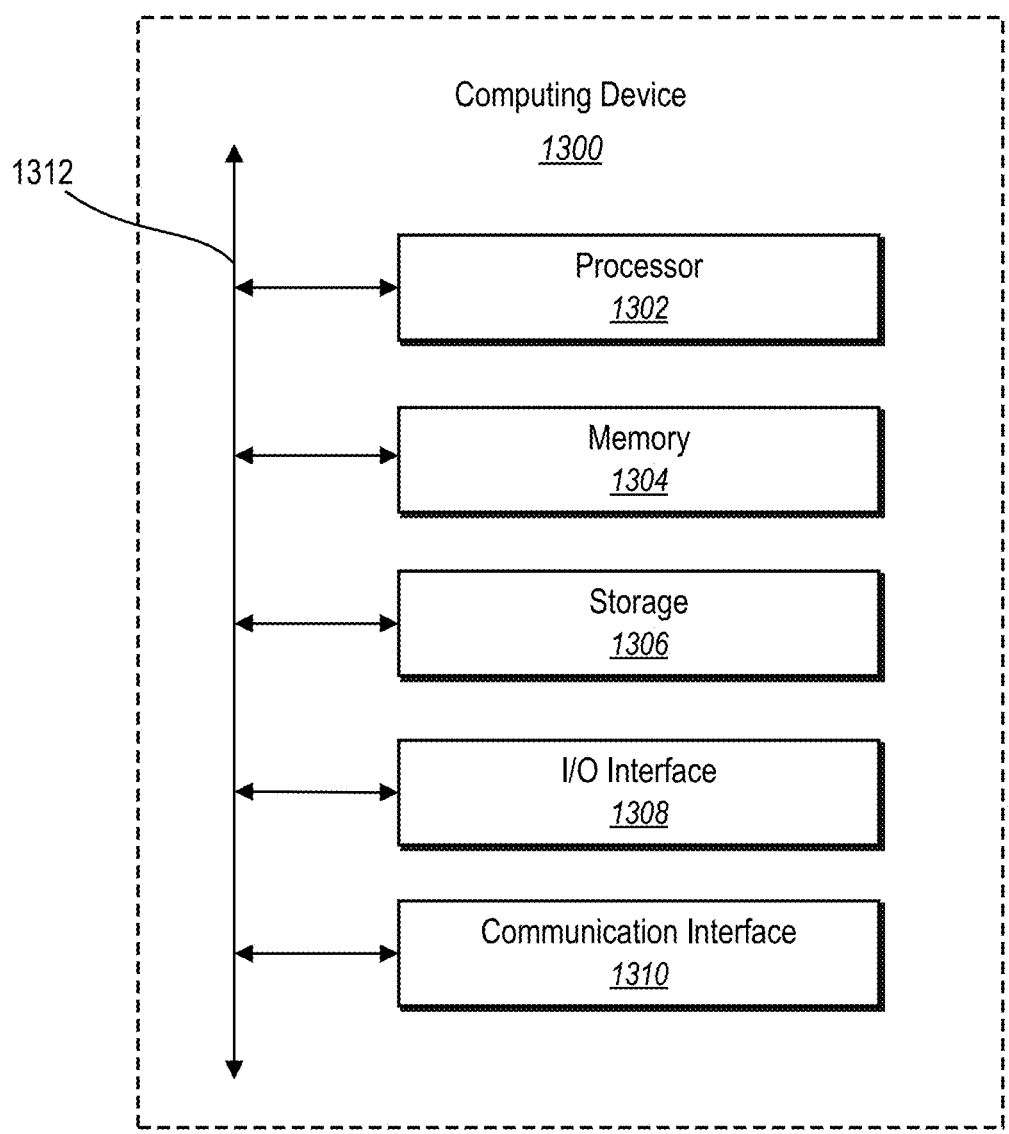
FIG. 13 illustrates a block diagram of an exemplary computing device in accordance with one or more embodiments.

FIG. 13 illustrates, in block diagram form, an exemplary computing device 1300 that may be configured to perform one or more of the processes described above. One will appreciate that the digital neural network rendering system 800 can comprise implementations of the computing device 1300. As shown by FIG. 13, the computing device can comprise a processor 1302, memory 1304, a storage device 1306, an I/O interface 1308, and a communication interface 1310. In certain embodiments, the computing device 1300 can include fewer or more components than those shown in FIG. 13. Components of computing device 1300 shown in FIG. 13 will now be described in additional detail.

In particular embodiments, processor(s) 1302 includes hardware for executing instructions, such as those making up a computer program. As an example and not by way of limitation, to execute instructions, processor(s) 1302 may retrieve (or fetch) the instructions from an internal register, an internal cache, memory 1304, or a storage device 1306 and decode and execute them.

The computing device 1300 includes memory 1304, which is coupled to the processor(s) 1302. The memory 1304 may be used for storing data, metadata, and programs for execution by the processor(s). The memory 1304 may include one or more of volatile and non-volatile memories, such as Random Access Memory ("RAM"), Read Only Memory ("ROM"), a solid state disk ("SSD"), Flash, Phase Change Memory ("PCM"), or other types of data storage. The memory 1304 may be internal or distributed memory.

The computing device 1300 includes a storage device 1306 includes storage for storing data or instructions. As an example and not by way of limitation, storage device 1306 can comprise a non-transitory storage medium described above. The storage device 1306 may include a hard disk drive (HDD), flash memory, a Universal Serial Bus (USB) drive or a combination of these or other storage devices.

The computing device 1300 also includes one or more input or output ("I/O") devices/interfaces 1308, which are provided to allow a user to provide input to (such as user strokes), receive output from, and otherwise transfer data to and from the computing device 1300. These I/O devices/interfaces 1308 may include a mouse, keypad or a keyboard, a touch screen, camera, optical scanner, network interface, modem, other known I/O devices or a combination of such I/O devices/interfaces 1308. The touch screen may be activated with a stylus or a finger.

The I/O devices/interfaces 1308 may include one or more devices for presenting output to a user, including, but not limited to, a graphics engine, a display (e.g., a display screen), one or more output drivers (e.g., display drivers), one or more audio speakers, and one or more audio drivers. In certain embodiments, devices/interfaces 1308 is configured to provide graphical data to a display for presentation to a user. The graphical data may be representative of one or more graphical user interfaces and/or any other graphical content as may serve a particular implementation.

The computing device 1300 can further include a communication interface 1310. The communication interface 1310 can include hardware, software, or both. The communication interface 1310 can provide one or more interfaces for communication (such as, for example, packet-based communication) between the computing device and one or more other computing devices 1300 or one or more networks. As an example and not by way of limitation, communication interface 1310 may include a network interface controller (NIC) or network adapter for communicating with an Ethernet or other wire-based network or a wireless NIC (WNIC) or wireless adapter for communicating with a wireless network, such as a WI-FI. The computing device 1300 can further include a bus 1312. The bus 1312 can comprise hardware, software, or both that couples components of computing device 1300 to each other.

In the foregoing specification, the invention has been described with reference to specific exemplary embodiments thereof. Various embodiments and aspects of the invention(s) are described with reference to details discussed herein, and the accompanying drawings illustrate the various embodiments. The description above and drawings are illustrative of the invention and are not to be construed as limiting the invention. Numerous specific details are described to provide a thorough understanding of various embodiments of the present invention.

The present invention may be embodied in other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel with one another or in parallel with different instances of the same or similar steps/acts. The scope of the invention is, therefore, indicated by the appended claims rather than by the foregoing description. All changes that come within the meaning and range of equivalency of the claims are to be embraced within their scope.

We claim:

1. A system for generating modified digital images from input digital images, comprising:
   one or more memories, comprising:
      a neural network comprising a rendering layer trained to generate synthesized digital images from input digital images portraying diffuse materials and input digital images portraying specular materials; and
      an input digital image; and
   at least one computing device storing instructions thereon, that, when executed by the at least one computing device, cause the system to:
      predict, utilizing the neural network, a material property set, a surface orientation map, and an illumination environment map based on the input digital image;
      replace at least one of the material property set, the surface orientation map, or the illumination environment map with a target material property set, a target surface orientation map, or a target illumination map; and
      utilize the rendering layer of the neural network to generate a modified digital image from the input digital image based on at least one of the target material property set, the target surface orientation map, or the target illumination map and at least two of the material property set, the surface orientation map, or the illumination environment map.

2. The system of claim 1, further comprising instructions that, when executed by the at least one computing device, cause the system to:
   replace the material property set with the target material property set; and
   utilize the rendering layer of the neural network to generate the modified digital image based on the target material property, the surface orientation map, and the illumination environment map.

3. The system of claim 1, wherein the input digital image portrays a first material corresponding to the material property set and portrays a second material, and further comprising instructions that, when executed by the at least one computing device, further cause the system to:
   predict, utilizing the neural network, the material property set corresponding to the first material and a second material property set corresponding to the second material;
   replace the material property set with the target material property set;
   replace the second material property set with a second target material property set; and
   utilize the rendering layer of the neural network to generate the modified digital image based on the target material property set, the second target material property set, the target surface orientation map, and the target illumination map.

4. The system of claim 1, further comprising instructions that, when executed by the at least one computing device, cause the system to predict, utilizing the neural network, the material property set based on a parametric representation that is differentiable with respect to incoming light directions, outgoing light directions, and material properties.

5. The system of claim 1, further comprising instructions that, when executed by the at least one computing device, cause the system to predict, utilizing the neural network, the surface orientation map, wherein the surface orientation map comprises an RGB digital image having a plurality of pixels with RBG values, where the RBG value of each pixel of the plurality of pixel encodes x, y, and z dimensions of a surface orientation of each pixel of an object portrayed in the digital image.

6. The system of claim 1, further comprising instructions that, when executed by the at least one computing device, cause the system to generate the modified digital image such that the modified digital image portrays a specular material.

7. A non-transitory computer readable medium storing instructions thereon that, when executed by at least one processor, cause a computer system to:
   receive an input digital image portraying an object within an illumination environment, wherein the object comprises a surface of a material, and wherein the surface has a surface normal direction;
   predict, utilizing a neural network comprising a rendering layer trained to generate synthesized digital images from input digital images portraying diffuse materials and input digital images portraying specular materials, a material property set, a surface orientation map, and an illumination environment map based on the input digital image;

replace at least one of the material property set, the surface orientation map, or the illumination environment map with a target material property set, a target surface orientation map, or a target illumination map; and utilize the rendering layer of the neural network to generate a modified digital image from the input digital image based on at least one of the target material property set, the target surface orientation map, or the target illumination map and at least two of the material property set, the surface orientation map, or the illumination environment map.

8. The non-transitory computer readable medium of claim 7, further comprising instructions that, when executed by the at least one processor, cause the computer system to:

replace the at least one of the material property set, the surface orientation map, or the illumination environment map by replacing the material property set with the target material property set; and utilize the rendering layer of the neural network to generate the modified digital image by generating the modified digital image based on the target material property set, the surface orientation map, and the illumination environment map.

9. The non-transitory computer readable medium of claim 7, further comprising instructions that, when executed by the at least one processor, cause the computer system to:

replace the at least one of the material property set, the surface orientation map, or the illumination environment map by replacing the illumination environment map with the target illumination map; and utilize the rendering layer of the neural network to generate the modified digital image by generating the modified digital image based on the material property set, the surface orientation map, and the target illumination map.

10. The non-transitory computer readable medium of claim 7, further comprising instructions that, when executed by the at least one processor, cause the computer system to:

receive a request to modify the surface normal direction by replacing the object with a second object that comprises a second surface of a second material having a second normal direction; and wherein the modified digital image portrays the second normal direction of the second object with the material of the object in the illumination environment of the input digital image.

11. The non-transitory computer readable medium of claim 7, further comprising instructions that, when executed by the at least one processor, cause the computer system to:

replace the at least one of the material property set, the surface orientation map, or the illumination environment map by replacing the surface orientation map with the target surface orientation map; and utilize the rendering layer of the neural network to generate the modified digital image by generating the modified digital image based on the material property set, the target surface orientation map, and the illumination environment map.

12. The non-transitory computer readable medium claim 7, further comprising instructions that, when executed by the at least one processor, cause the computer system to generate the modified digital image such that the modified digital image portrays a specular material.

13. The non-transitory computer readable medium of claim 7, further comprising instructions that, when executed by the at least one processor, cause the computer system to predict, utilizing the neural network, the material property set based on a parametric representation that is differentiable with respect to incoming light directions, outgoing light directions, and material properties.

14. In a digital medium environment for computer-based editing of digital images, a computer-implemented method of generating a trained neural network for rendering modified digital images, comprising:

providing a training input image to a neural network, wherein the training input image corresponds to a training material property set, a training surface orientation map, and a training illumination environment map;

predicting, via the neural network, a material property set, a surface orientation map, and an illumination environment map based on the training input image;

generating a synthesized training image, via a rendering layer of the neural network, based on the predicted material property set, the predicted surface orientation map, and the predicted illumination environment map;

determining a loss measure by comparing:
the synthesized training image with the training input image,
the training material property set with the predicted material property set, and
the training surface orientation map with the predicted surface orientation map; and training the neural network utilizing the determined loss measure to generate a modified digital image from an input digital image.

15. The method of claim 14, further comprising:

accessing a training target image and a training target property, wherein the training target image comprises the training input image modified to portray the training target property:

providing the training target property to the neural network; and generating a synthesized target image, via the rendering layer of the neural network, based on the training target property and at least two of the following: the predicted material property set, the predicted surface orientation map, and the predicted illumination environment map.

16. The method of claim 15, wherein determining the loss measure further comprises comparing the training target image with the synthesized target image.

17. The method of claim 15, wherein the training target property comprises at least one of a target material property set different than the training material property set, a target training surface orientation map different than the surface orientation map, or a target illumination environment map different from the training illumination environment map.

18. The method of claim 15, wherein predicting the material property set based on the training input image comprises utilizing a parametric representation that is differentiable with respect to incoming light directions, outgoing light directions, and material properties.

19. The method of claim 18, wherein the parametric representation comprises a linear combination of a bidirectional reflectance distribution function database comprising bidirectional reflectance distribution functions corresponding to a plurality of materials.

20. The method of claim 15, wherein the illumination environment map comprises a spherical panorama digital image comprising a plurality of pixels, and wherein a position of each pixel in the plurality of pixels of the spherical panorama digital image reflects an incoming light direction corresponding to light rays portrayed in the input digital image.

\* \* \* \* \*